(12) United States Patent
Lee

(10) Patent No.: US 11,882,649 B2
(45) Date of Patent: *Jan. 23, 2024

(54) DISPLAY DEVICE

(71) Applicant: Samsung Display Co., Ltd., Yongin-Si (KR)

(72) Inventor: Hee-Kwon Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/948,564

(22) Filed: Sep. 20, 2022

(65) Prior Publication Data

US 2023/0042192 A1 Feb. 9, 2023

Related U.S. Application Data

(63) Continuation of application No. 17/108,510, filed on Dec. 1, 2020, now Pat. No. 11,464,105.

(30) Foreign Application Priority Data

Feb. 14, 2020 (KR) .................. 10-2020-0018433

(51) Int. Cl.
*H05K 1/02* (2006.01)
*H05K 1/18* (2006.01)

(52) U.S. Cl.
CPC ......... *H05K 1/0259* (2013.01); *H05K 1/0281* (2013.01); *H05K 1/189* (2013.01); *H05K 2201/049* (2013.01); *H05K 2201/058* (2013.01); *H05K 2201/10128* (2013.01); *H05K 2201/2009* (2013.01); *H05K 2201/2063* (2013.01)

(58) Field of Classification Search
CPC .... H05K 1/0259; H05K 1/0281; H05K 1/189; H05K 1/028; H05K 1/147; H05K 2201/1049; H05K 2201/058; H05K 2201/10128; H05K 2201/2009; H05K 2201/2063; H05K 2201/05; H05K 3/305; H05K 3/361; G09F 9/301; G06F 1/1652; G06F 2203/04102
See application file for complete search history.

(56) References Cited

U.S. PATENT DOCUMENTS 9,423,834 B2 8/2016 Park et al.
9,798,414 B2 10/2017 Kim et al.
11,038,006 B1 6/2021 Wu
(Continued)

FOREIGN PATENT DOCUMENTS

KR 10-2008-035784 4/2008
KR 10-2016-0106829 9/2016
(Continued)

*Primary Examiner* — Hoa C Nguyen
*Assistant Examiner* — Amol H Patel
(74) *Attorney, Agent, or Firm* — F. CHAU & ASSOCIATES, LLC

(57) ABSTRACT

A display device including: a display module including a display panel for displaying an image and a circuit board connected to the display panel; a support plate disposed on a surface of the display module; and a conductive adhesive film disposed between the circuit board and the support plate, the conductive adhesive film including: a double-sided adhesive film fixed to a surface of the support plate and a surface of the circuit board; and a single-sided adhesive film fixed to one of the surface of the support plate and the surface of the circuit board.

24 Claims, 20 Drawing Sheets

(56) References Cited

U.S. PATENT DOCUMENTS

| | | |
|---|---|---|
| 11,231,627 B2 | 1/2022 | Abe |
| 2020/0022261 A1 | 1/2020 | Choi |
| 2021/0142715 A1 | 5/2021 | Wang et al. |
| 2021/0204455 A1 | 7/2021 | Ha |
| 2021/0259097 A1 | 8/2021 | Lee |
| 2021/0356794 A1 | 11/2021 | Yu et al. |
| 2021/0373381 A1 | 12/2021 | Matsuoka |

FOREIGN PATENT DOCUMENTS

| | | |
|---|---|---|
| KR | 10-2020-0005177 | 1/2020 |
| KR | 10-2020-0007115 | 3/2020 |
| KR | 10-2020-080752 | 7/2020 |

DISPLAY DEVICE

1. TECHNICAL FIELD

The present inventive concept relates to a display device. More particularly, the present inventive concept relates to a foldable display device.

2. DESCRIPTION OF THE RELATED ART

A display device is an output device for presentation of information in visual form. The display device may include a variety of types of display panels to display information. The display panels may include a liquid crystal display, a light-emitting diode display, a quantum dot display, etc. In recent years, a rollable or foldable display device that includes a flexible display module, which can be bent or folded, has been developed. The flexible display module includes a flexible display panel and a variety of functional members. The flexible display panel includes a base member, a variety of functional layers disposed on the base member, and pixels disposed on the base member, for example.

SUMMARY

An exemplary embodiment of the inventive concept provides a display device including: a display module including a display panel for displaying an image and a circuit board connected to the display panel; a support plate disposed on a surface of the display module; and a conductive adhesive film disposed between the circuit board and the support plate, the conductive adhesive film including: a double-sided adhesive film fixed to a surface of the support plate and a surface of the circuit board; and a single-sided adhesive film fixed to one of the surface of the support plate and the surface of the circuit board.

The double-sided adhesive film may include: a first conductive film; a first conductive adhesive disposed between the first conductive film and the surface of the support plate; and a second conductive adhesive disposed between the first conductive film and the surface of the circuit board.

The single-sided adhesive film may include: a second conductive film; and a third conductive adhesive disposed between the second conductive film and the surface of the circuit board.

The second conductive film may be thicker than the first conductive film.

The second conductive film may be spaced apart from the first conductive film.

The circuit board may include: a ground line; a cover layer disposed on the ground line and having an opening that exposes a portion of the ground line; and a step difference compensation film disposed in the opening and connected to the portion of the ground line.

The step difference compensation film may include: a third conductive film; and a fourth conductive adhesive disposed between the third conductive film and the portion of the ground line, wherein the third conductive film is attached to the second conductive adhesive and the third conductive adhesive, and the ground line is connected to the support plate through the step difference compensation film, the double-sided adhesive film, and the single-sided adhesive film.

The conductive adhesive film may further include a connection portion that connects the first conductive film to the second conductive film.

The connection portion may include a fourth conductive film that is integrally formed with the first and second conductive films.

The fourth conductive film may have a same thickness as one of the first and second conductive films.

The display module may further include: a first circuit element disposed on the circuit board and overlapped by the single-sided adhesive film; and a second circuit element disposed on the circuit board and overlapped by the double-sided adhesive film, and wherein the first circuit element is larger than the second circuit element.

The display module may include a folding area and a plurality of non-folding areas.

The conductive adhesive film may be disposed in one non-folding area of the non-folding areas.

The support plate may be a metal plate.

The display device may further include a buffer film disposed between the display panel and the support plate.

The display module may further include a window disposed on the display panel and comprising a flexible material.

An exemplary embodiment of the inventive concept provides a display device including: a display module including a display panel for displaying an image and a circuit board electrically connected to the display panel, the display module further including a folding area and a plurality of non-folding areas disposed adjacent to opposite ends of the folding area: a support plate disposed on a surface of the display module to support the display module; and a conductive adhesive film disposed between the circuit board and the support plate in at least one non-folding area of the non-folding areas to form an electrostatic path, the conductive adhesive film including: a double-sided adhesive film fixed to a surface of the support plate and a surface of the circuit board; and a single-sided adhesive film fixed to one of the surface of the support plate and the surface of the circuit board, wherein the display module further comprises a circuit element disposed on the circuit board to overlap the single-sided adhesive film.

The double-sided adhesive film may include: a first conductive film; a first conductive adhesive disposed between the first conductive film and the surface of the support plate; and a second conductive adhesive disposed between the first conductive film and the surface of the circuit board.

The single-sided adhesive film may include: a second conductive film; and a third conductive adhesive disposed between the second conductive film and the surface of the circuit board.

The circuit board may include: a ground line; a cover layer disposed on the ground line to cover the ground line, wherein the cover layer include an opening to expose a portion of the ground line; and a step difference compensation film disposed in the opening and electrically connected to the portion of the ground line.

The step difference compensation film may include: a third conductive film; and a fourth conductive adhesive disposed between the third conductive film and the portion of the ground line, wherein the third conductive film is electrically connected to the first conductive film and the second conductive film respectively through the second conductive adhesive and the third conductive adhesive.

The second conductive film may be thicker than the first conductive film.

The conductive adhesive film may further include a connection portion that connects the first conductive film to the second conductive film.

The connection portion may include a fourth conductive film that is integrally formed with the first and second conductive films and has a same thickness as one of the first and second conductive films.

BRIEF DESCRIPTION OF THE DRAWINGS

The above and other features of the present inventive concept will become more apparent by describing in detail exemplary embodiments thereof with reference to the accompanying drawings wherein.

DETAILED DESCRIPTION OF THE EMBODIMENTS

Figure 1:
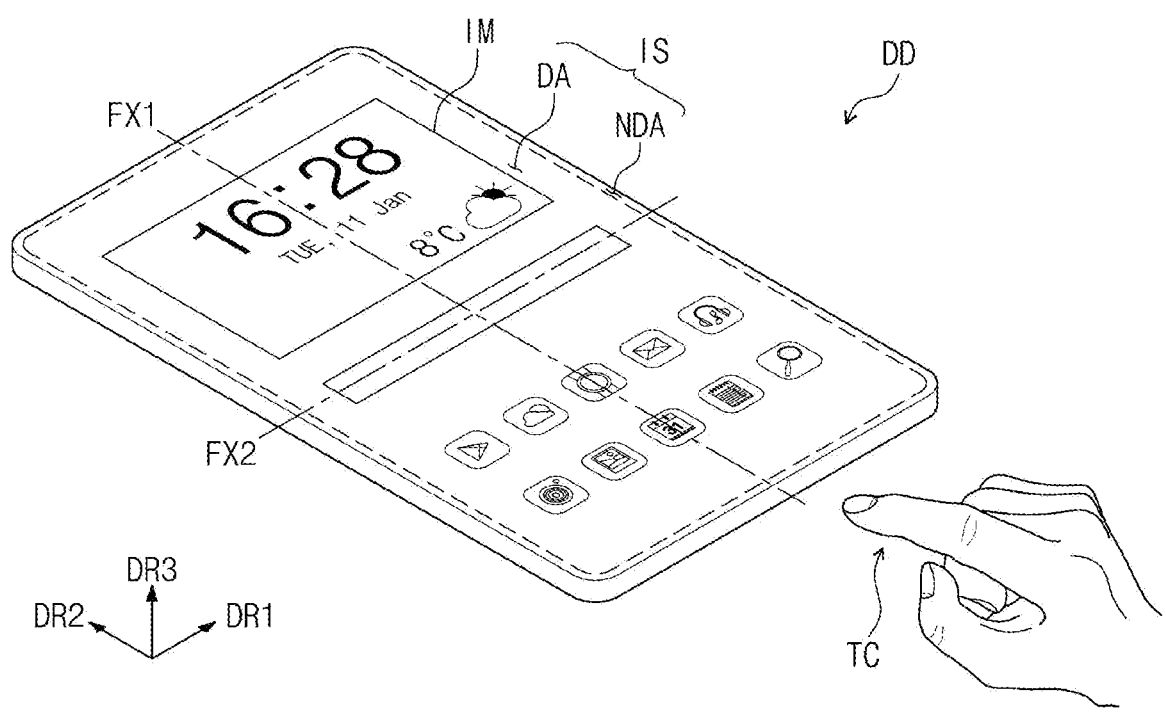
FIG. 1 is a perspective view showing a display device according to an exemplary embodiment of the present inventive concept.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout. In the drawings, the thickness, ratio, and dimension of components may exaggerated.

As used herein, the singular forms, "a", "an" and "the" are intended to include the plural forms as well, unless the context clearly indicates otherwise.

Hereinafter, exemplary embodiments of the present inventive concept will be explained in detail with reference to the accompanying drawings.

FIG. 1 is a perspective view showing a display device DD according to an exemplary embodiment of the present inventive concept.

Referring to FIG. 1, the display device DD has a rectangular shape with short sides in a first direction DR1 and long sides in a second direction DR2 crossing the first direction DR1. However, the shape of the display device DD should not be limited to the rectangular shape, and the display device DD may have a variety of shapes.

The display device DD may be a foldable electronic device. For example, the display device DD according to an exemplary embodiment of the present inventive concept may be folded about folding axes FX1 and FX2 extending in a predetermined direction. Hereinafter, a state in which the display device DD is folded about the folding axes FX1 and FX2 is referred to as a "folded state", and a state in which the display device DD is not folded is referred to as a "non-folded state". The folding axes FX1 and FX2 may be rotational axes generated when the display device DD is folded, and the folding axes FX1 and FX2 may be formed by components and structures of the display device DD.

The folding axes FX1 and FX2 may extend in the first direction DR1 or the second direction DR2. In an exemplary embodiment of the present inventive concept, the folding axis extending in the second direction DR2 may be referred to as a "first folding axis" FX1, and the folding axis extending in the first direction DR1 may be referred to as a "second folding axis" FX2. The display device DD may include one of the first and second folding axes FX1 and FX2. The display device DD may be folded about one of the first and second folding axes FX1 and FX2. For example, the display device DD may be folded about the first folding axis FX1, returned to its unfolded state and then folded about the second folding axis FX2.

The display device DD according to the present embodiment may be applied to a large-sized electronic item, such as a television set and a monitor, and a small and medium-sized electronic item, such as a mobile phone, a tablet computer, a car navigation unit, and a game unit. These items are merely exemplary, and thus, the display device DD may be applied to a variety of other electronic items.

As shown in FIG. 1, the display device DD may display an image IM on a display surface IS that is substantially parallel to each of the first and second directions DR1 and DR2. The display surface IS on which the image IM is displayed may correspond to a front surface of the display device DD. However, when the display device DD is in a folded state, a portion of the display surface IS may be located on a rear surface of the display device DD.

The display surface IS of the display device DD may be divided into a plurality of areas. The display surface IS of the display device DD may include a display area DA and a non-display area NDA.

The display area DA may be an area on which the image IM is displayed, and a user may view the image IM through the display area DA. The display area DA may have a quadrangular shape. The non-display area NDA may surround the display area DA.

Accordingly, the display area DA may have a shape demarcated by the non-display area NDA. However, this is merely exemplary, and the non-display area NDA may be disposed adjacent to only one side of the display area DA or may be omitted.

The non-display area NDA is an area adjacent to the display area DA, and the image IM is not displayed through the non-display area NDA. The display device DD includes a bezel area corresponding to the non-display area NDA.

The display device DD according to an exemplary embodiment of the present inventive concept may be a touch-type display and may sense a user input TC applied thereto from the outside. The user input TC includes various forms of external inputs, such as a portion of the user's body, light, heat, or pressure. In the present exemplary embodiment, the user input TC is shown as a user's hand applied to the front surface of the display device DD. However, this is merely exemplary, the user input TC may be provided in various forms as described above, and the display device DD may sense the user input TC applied to a side or rear surface of the display device DD depending on a structure of the display device DD.

The display device DD may activate the display surface IS to display the image IM while sensing the user input TC. In the present exemplary embodiment, an area w % here the user input TC is sensed may be in the display area DA on which the image IM is displayed. However, this is merely exemplary, and the area where the user input TC is sensed may be in the non-display area NDA or over the entire display surface IS.

Figure 2A:
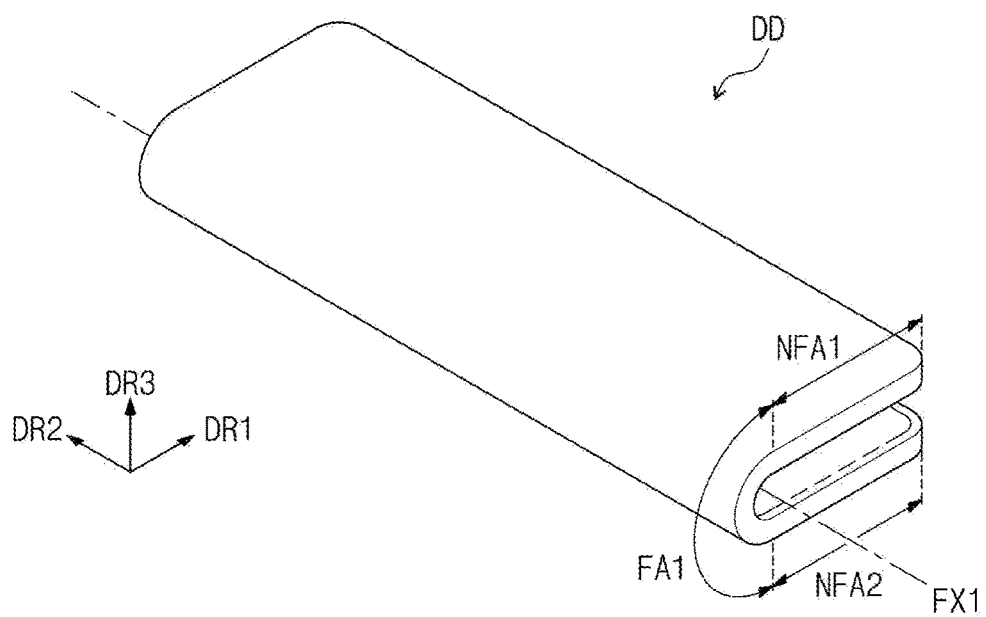
FIG. 2A is a perspective view showing a state in which the display device shown in FIG. 1 is inwardly folded (in-folded) about a first folding axis.
Figure 2B:
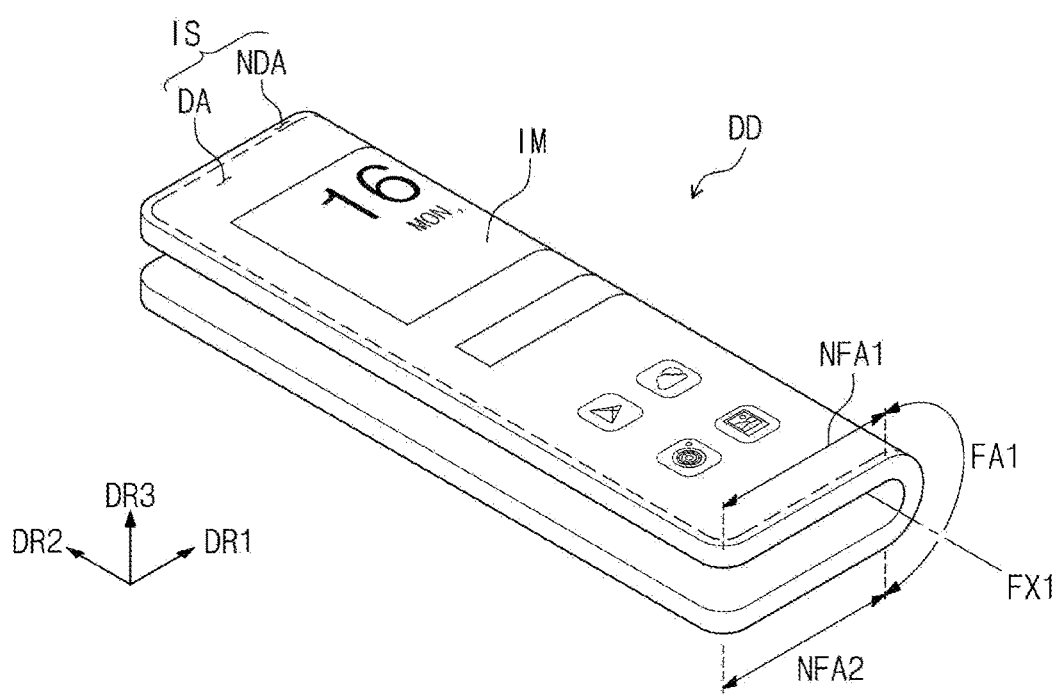
FIG. 2B is a perspective view showing a state in which the display device shown in FIG. 1 is outwardly folded (out-folded) about the first folding axis.

FIG. 2A is a perspective view showing a state in which the display device DD shown in FIG. 1 is inwardly folded (in-folded) about the first folding axis FX1, and FIG. 2B is a perspective view showing a state in which the display device DD shown in FIG. 1 is outwardly folded (out-folded) about the first folding axis FX1.

Referring to FIGS. 1 and 2A, the display device DD may be the foldable display device. The display device DD may be folded about the folding axes, e.g., the first folding axis FX1 and the second folding axis FX2, extending in the predetermined direction.

The display device DD may include a plurality of areas depending on its operation mode. The areas may include a folding area FA1 and at least one non-folding area NFA1 and NFA2. The folding area FA1 may be located between the two non-folding areas NFA1 and NFA2.

The folding area FA1 is folded about the first folding axis FX1 to form a curvature. The first folding axis FX1 may extend in the second direction DR2, e.g., in a major axis direction of the display device DD. The folding area FA1 may be folded about the first folding axis FX1 and may extend in the second direction DR2.

As an example, the non-folding areas NFA1 and NFA2 may include a first non-folding area NFA1 and a second non-folding area NFA2. The first non-folding area NFA1 is disposed adjacent to one side of the folding area FA1 in the first direction DR1, and the second non-folding area NFA2 is disposed adjacent to the other side of the folding area FA1 in the first direction DR1. For example, the first non-folding area NFA1 may be disposed adjacent to a first side of the folding area FA1 along the first direction DR1 and the second non-folding area NFA2 may be disposed adjacent to a second side of the folding area FA1 along the first direction DR1. The first and second sides of the folding area FA1 may be opposite each other and extend along the second direction DR2.

The display device DD may be inwardly folded (in-folded) or outwardly folded (out-folded). In the present exemplary embodiment, in-folded may refer to when the display device DD is folded such that display surfaces IS of the first and second non-folding areas NFA1 and NFA2 face each other, and out-folded may refer to when the display device DD is folded such that the display surfaces IS of different non-folding areas NFA1 and NFA2 face away from each other. For example, when the display device DD is in-folded the display surfaces IS of the first and second non-folding areas NFA1 and NFA2 are protected by the back side of the display device DD, and when the display device DD is out-folded the display surfaces IS of the first and second non-folding areas NFA1 and NFA2 are exposed to the outside.

In other words, when the display device DD is in-folded a first portion of the display surface IS faces a second portion thereof, and when the display device DD is out-folded a first portion of the rear surface of the display device DD is folded to face a second portion thereof.

The display device DD shown in FIG. 2A may be inwardly folded (in-folded) to allow the display surface IS of the first non-folding area NFA1 to face the display surface IS of the second non-folding area NFA2. As the first non-folding area NFA1 rotates in a clockwise direction about the first folding axis FX1, the display device DD may be inwardly folded. The first folding axis FX1 may be located at a center of the display device DD in the first direction DR1 to inwardly fold the display device DD such that the first non-folding area NFA1 and the second non-folding area NFA2 are aligned with each other.

Referring to FIG. 2B, the display device DD may be outwardly folded (out-folded) about the first folding axis FX1. The display device DD may display the image IM when the display surface IS of the first non-folding area NFA1 and the display surface IS of the second non-folding area NFA2 are exposed to the outside. Further, the image IM may also be displayed on the display surface IS of the folding area FA1 exposed to the outside. As shown in FIG. 1, the display device DD may display the image IM while being in an unfolded state. The first non-folding area NFA1, the second non-folding area NFA2, and the folding area FA1 may respectively display images that provide independent information or may respectively display portions of one image.

The display device DD may be manufactured to have both the in-folded state and the out-folded state or may be manufactured to have one of the in-folded and out-folded states.

Figure 3A:
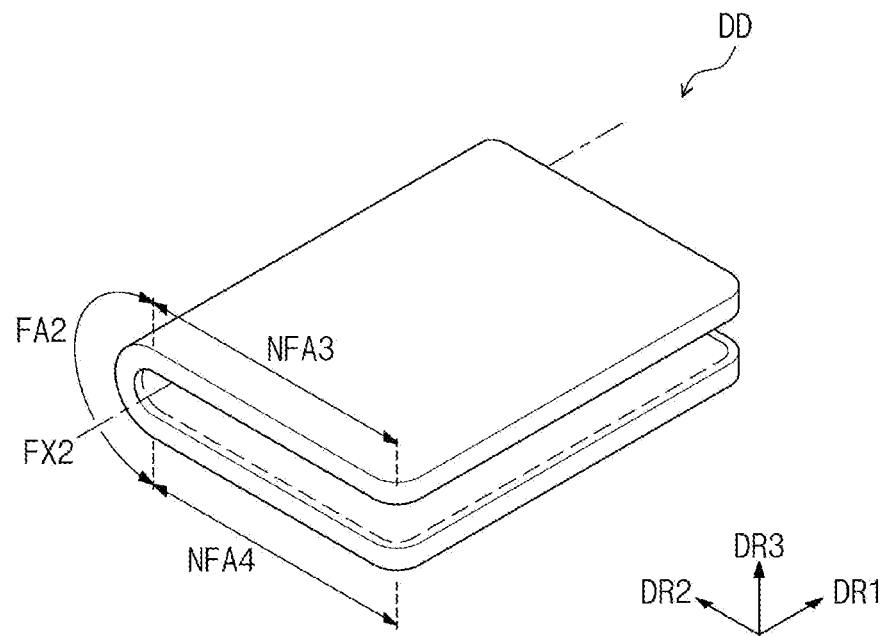
FIG. 3A is a perspective view showing a state in which the display device shown in FIG. 1 is inwardly folded (in-folded) about a second folding axis.
Figure 3B:
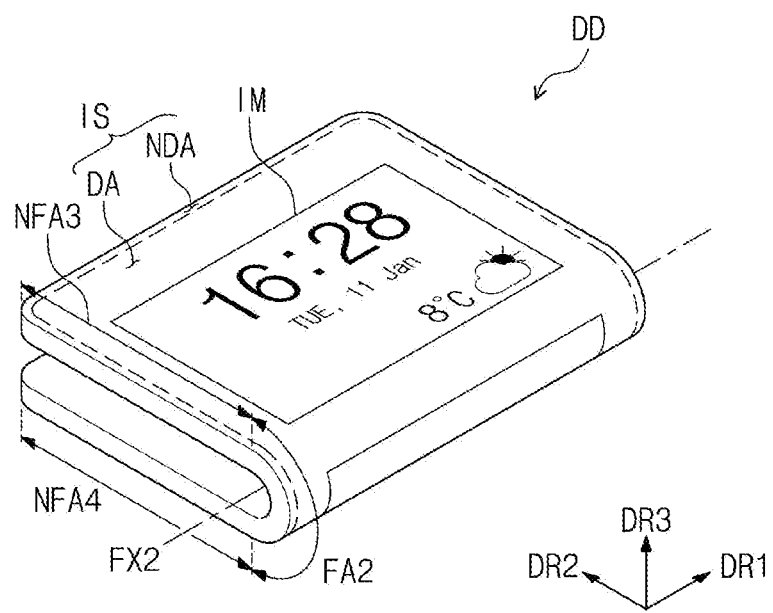
FIG. 3B is a perspective view showing a state in which the display device shown in FIG. 1 is outwardly folded (out-folded) about the second folding axis.

FIG. 3A is a perspective view showing a state in which the display device DD shown in FIG. 1 is inwardly folded (in-folded) about the second folding axis FX2, and FIG. 3B is a perspective view showing a state in which the display device DD shown in FIG. 1 is outwardly folded (out-folded) about the second folding axis FX2.

Referring to FIGS. 3A and 3B, the display device DD may be inwardly or outwardly folded about the second folding axis FX2. The second folding axis FX2 may extend in the first direction DR1, e.g., a minor axis direction.

The display device DD may include a plurality of areas depending on its operation mode. The areas may include a folding area FA2 and at least one non-folding area NFA3 and NFA4. The folding area FA2 may be located between the two non-folding areas NFA3 and NFA4.

The folding area FA2 is folded about the second folding axis FX2 to form a curvature. The folding area FA2 may be folded about the second folding axis FX2 and may extend in the first direction DR1.

As an example, the non-folding areas NFA3 and NFA4 may include a third non-folding area NFA3 and a fourth non-folding area NFA4. The third non-folding area NFA3 is disposed adjacent to one side of the folding area FA2 in the second direction DR2, and the fourth non-folding area NFA4 is disposed adjacent to the other side of the folding area FA2 in the second direction DR2. For example, the third non-folding area NFA3 may be disposed adjacent to a first side of the folding area FA2 along the second direction DR2 and the fourth non-folding area NFA4 may be disposed adjacent to a second side of the folding area FA2 along the second direction DR2. The first and second sides of the folding area FA2 may be opposite each other and extend along the first direction DR1.

In the present exemplary embodiment, one folding area FA1 or FA2 is provided in the display device DD, however, the present inventive concept should not be limited thereto or thereby. According to another exemplary embodiment of the present inventive concept, a plurality of folding areas may be provided in the display device DD.

Figure 4:
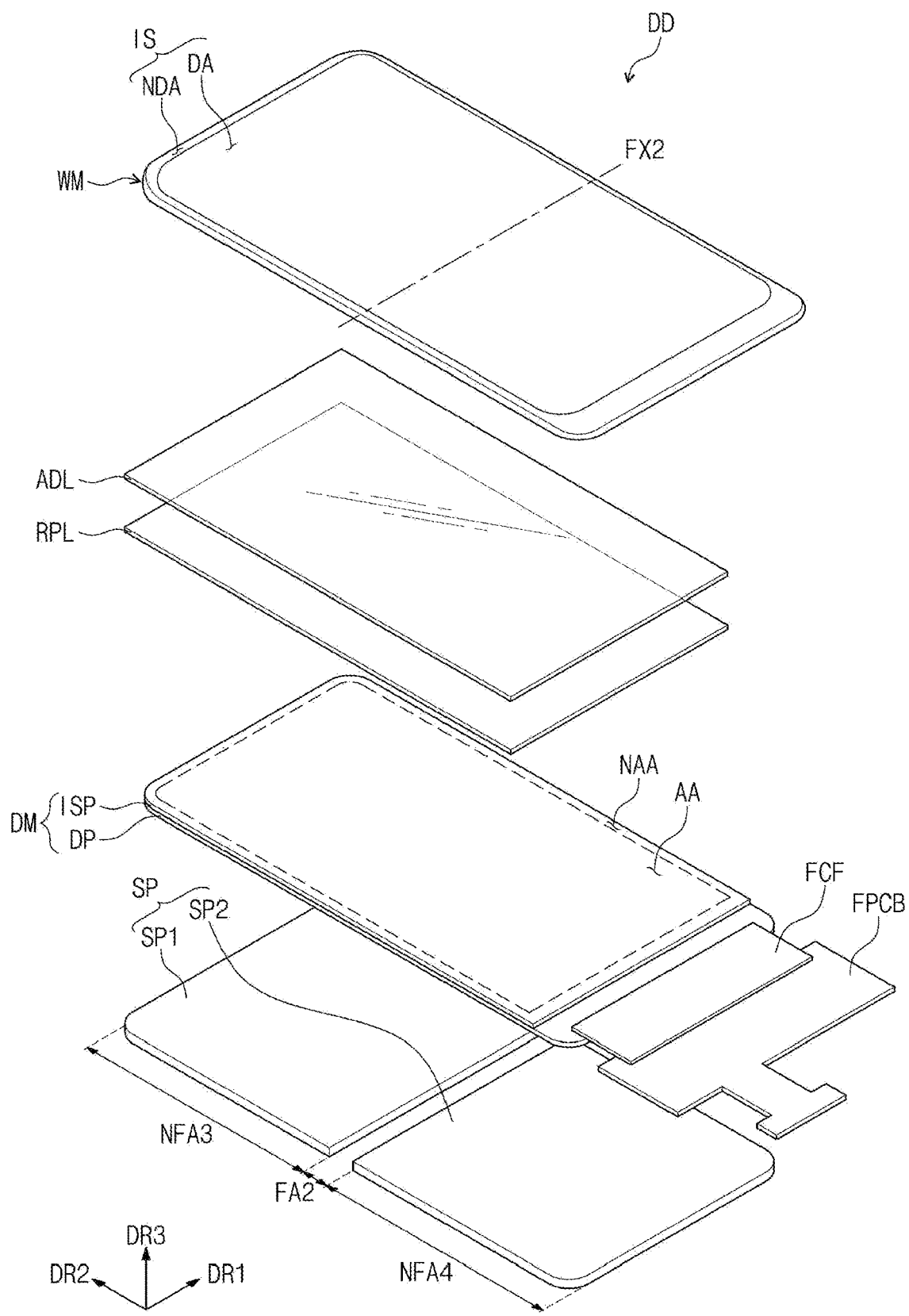
FIG. 4 is an exploded perspective view showing a display device according to an exemplary embodiment of the present inventive concept.

FIG. 4 is an exploded perspective view showing the display device DD according to an exemplary embodiment of the present inventive concept.

Referring to FIG. 4, the display device DD according to an exemplary embodiment of the present inventive concept may include a display module DM for displaying the image and a window WM disposed on the display module DM. The display module DM may be a portion of the display device DD (refer to FIG. 1), and the image may be generated by the display module DM.

The display module DM may include a display panel DP and an input sensing unit ISP. The display panel DP according to an exemplary embodiment of the present inventive concept may be a light-emitting type display panel, however, it is not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and a quantum rod. Hereinafter, the organic light emitting display panel will be described as a representative example of the display panel DP.

The display panel DP may be a flexible display panel. Accordingly, the display panel DP may be entirely rolled or may be folded or unfolded about the second folding axis FX2.

The input sensing unit ISP may be disposed directly on the display panel DP. According to an exemplary embodiment of the inventive concept, the input sensing unit ISP may be formed on the display panel DP through successive processes. In other words, when the input sensing unit ISP is disposed directly on the display panel DP, an adhesive film may not be disposed between the input sensing unit ISP and the display panel DP, however, the present inventive concept should not be limited thereto. The adhesive film may be disposed between the input sensing unit ISP and the display panel DP. In this case, the input sensing unit ISP is not manufactured together with the display panel DP through the successive processes. In other words, the input sensing unit ISP may be fixed to an upper surface of the display panel DP by the adhesive film after being manufactured through a separate process.

The display panel DP may generate the image, and the input sensing unit ISP may obtain coordinate information about the user input TC, e.g., a touch event.

An upper surface of the window WM forms the display surface IS of the display device DD. The window WM may be optically transparent. Therefore, the user may easily perceive the image generated by the display module DM through the window WM.

The window WM may include an optically transparent insulating material. For example, the window WM may include a glass substrate or a synthetic resin film. When the window WM includes the glass substrate, the window WM may have a thickness equal to or smaller than about 80 micrometers, e.g., about 30 micrometers, however, the thickness of the window WM is not limited thereto.

When the window WM includes the synthetic resin film, the window IM may include a polyimide (PI) film or a polyethylene terephthalate (PET) film.

The window WM may have a single-layer or multi-layer structure. For example, the window WM may include a plurality of synthetic resin films coupled to each other by an adhesive or the glass substrate and the synthetic resin film coupled to the glass substrate by the adhesive.

The window WM may include a flexible material. Thus, the window WM may be folded or unfolded about the second folding axis FX2. In other words, the shape of the window WM may be changed when the shape of the display module DM is changed.

The window WM transmits the image from the display module DM and buffers external impacts to prevent the display module DM from being damaged or malfunctioning due to the external impacts. The external impacts may be an external force represented by pressure or stress, which can cause defects in the display module DM.

A window protective layer may be further disposed on the window WM. The window protective layer may increase an impact resistance of the window WM and may prevent the window WM from shattering when impacted. The window protective layer may include at least one of a urethane-based resin, an epoxy-based resin, a polyester-based resin, a polyether-based resin, an acrylate-based resin, an acrylonitrile-butadiene-styrene (ABS) resin, and a rubber. As an example, the window protective layer may include at least one of phenylene, polyethylene terephthalate (PET), polyimide (PI), polyamide (PA), polyethylene naphthalate (PEN), and polycarbonate (PC).

A window functional layer may be further disposed between the window WM and the window protective layer. For example, the window functional layer may include at least one of an anti-fingerprint layer, an anti-glare layer, and a hard coating layer.

One or more functional layers may be disposed between the display module DM and the window WM. As an example, one of the functional layers may be an anti-reflective layer RPL that blocks the reflection of external light. The anti-reflective layer RPL may prevent components included in the display module DM from being perceived from the outside due to the external light incident through the front surface of the display device DD. The anti-reflective layer RPL may include a retarder and a polarizer. The retarder may be a film type or liquid crystal coating type and may include a λ/2 retarder and/or a λ/4 retarder. The polarizer may be a film type or liquid crystal coating type. The film type polarizer may include a stretching type synthetic resin film, and the liquid crystal coating type polarizer may include liquid crystals aligned in a predetermined alignment. The retarder and the polarizer may be implemented as one polarizing film. The functional layers may further include a protective film disposed on or under the anti-reflective layer RPL.

The anti-reflective layer RPL may be disposed on the input sensing unit ISP. In other words, the anti-reflective layer RPL may be disposed between the input sensing unit ISP and the window WM. The anti-reflective layer RPL and the window WM may be coupled to each other by an adhesive film ADL. The adhesive film ADL may cover the entire surface of the anti-reflective layer RPL facing the window WM. An adhesive film that fixes the anti-reflective layer RPL to the input sensing unit ISP may be further disposed between the input sensing unit ISP and the anti-reflective layer RPL.

As an example, the adhesive film ADL may be an optically clear adhesive (OCA) film. However, the adhesive film ADL is not limited thereto and may include a variety of adhesives. For example, the adhesive film ADL may include an optically clear resin (OCR) or a pressure sensitive adhesive film (PSA).

The display module DM may display the image in response to electrical signals and may transmit/receive information about the external input. The display module DM may include an active area AA and a peripheral area NAA. The active area AA may be an area through which the image provided from the display module DM transmits to the outside through the window WM.

The peripheral area NAA may be adjacent to the active area AA. For example, the peripheral area NAA may surround the active area AA. However, this is merely exemplary, and the peripheral area NAA may have various shapes and should not be particularly limited. For example, the peripheral area NAA may be disposed adjacent to less than all sides of the active area AA. According to an exemplary embodiment of the inventive concept, the active area AA of the display module DM may correspond to at least a portion of the display area DA.

The display module DM may further include a circuit board FPCB and a flexible circuit film FCF.

The circuit board FPCB may be connected to the flexible circuit film FCF to be electrically connected to the display panel DP. The circuit board FPCB may include a control chip, a plurality of passive elements, and a plurality of active elements, which are mounted thereon. The circuit board FPCB may include a flexible film material the same as the flexible circuit film FCF.

The flexible circuit film FCF may be connected to the display panel DP to electrically connect the display panel DP to the circuit board FPCB. The flexible circuit film FCF may be coupled to the peripheral area NAA of the display panel DP through a bonding process. A driving chip may be mounted on the flexible circuit film FCF. Since the flexible circuit film FCF is bent to surround a side surface of the display module DM, the circuit board FPCB coupled to the flexible circuit film FCF may be disposed on a rear surface of the display module DM.

The driving chip may include driving elements to drive pixels of the display panel DP, e.g., a data driving circuit. In an exemplary embodiment of the present inventive concept, one flexible circuit film FCF is shown, however, the number of the flexible circuit films should not be limited to one. The flexible circuit film FCF may be provided in plural and may be connected to the display panel DP. The driving chip may be mounted directly on the display panel DP. In this case, the portion of the display panel DP on which the driving chip is mounted may be bent to be disposed on the rear surface of the display module DM.

The input sensing unit ISP may be electrically connected to the circuit board FPCB through the flexible circuit film FCF. However, the present inventive concept is not limited thereto. In other words, the display module DM may further include a separate flexible circuit film to electrically connect the input sensing unit ISP to the circuit board FPCB.

As shown in FIG. 4, the display device DD may further include a support plate SP that is disposed on the rear surface of the display module DM and supports the display module DM. The support plate SP, the display module DM and the window WM may be arranged in a third direction DR3. The support plate SP may be a metal plate. The support plate SP may be a stainless steel plate. The support plate SP may be stronger than the display module DM.

The support plate SP may include a plurality of support plates SP1 and SP2. The number of support plates SP1 and SP2 may correspond to the number of non-folding areas NFA3 and NFA4. As an example, the support plate SP may include a first support plate SP1 and a second support plate SP2 be spaced apart from the first support plate SP1. For example, the first and second support plates SP1 and SP2 may be separated by the folding area FA2. For example, a gap corresponding to the side of the folding area FA2 may be located between the first and second support plates SP1 and SP2 along the first direction DR1. The first and second support plates SP1 and SP2 may be disposed to respectively correspond to the non-folding areas NFA3 and NFA4. In other words, the first support plate SP1 may be disposed to correspond to the third non-folding area NFA3 of the display module DM, and the second support plate SP2 may be disposed to correspond to the fourth non-folding area NFA4 of the display module DM. When the display module DM is folded about the second folding axis FX2, the first and second support plates SP1 and SP2 may be spaced apart from each other in the second direction DR2.

The first and second support plates SP1 and SP2 may be spaced apart from each other in the folding area FA2. The first and second support plates SP1 and SP2 may overlap a portion of the folding area FA2. In other words, a distance between the first and second support plates SP1 and SP2 in the second direction DR2 may be smaller than a width of the folding area FA2 in the second direction DR2. In other words, the gap between the first and second support plates SP1 and SP2 in the second direction DR2 may be smaller than the width of the folding area FA2 in the second direction DR2.

The support plate SP may further include a connection module to connect the first and second support plates SP1 and SP2. The connection module may include a hinge module or a multi-joint module.

In an exemplary embodiment of the present inventive concept, the support plate SP includes two support plates SP1 and SP2, however, the number of the support plates is not limited to two. In other words, when the number of the second folding axes FX2 increases, the support plate SP may include a plurality of support plates separated from each other with respect to the second folding axis FX2. For example, when there are two folding axes arranged along the second direction DR2, three support plates may be provided.

FIG. 4 shows a structure in which the support plate SP is divided into the first and second support plates SP1 and SP2, however, the present inventive concept is not limited thereto. In other words, the support plate SP may be formed in a single-plate shape to be disposed to correspond to the third and fourth non-folding areas NFA3 and NFA4 and the folding area FA2. In this case, the support plate SP may be provided with a plurality of holes passing through the support plate SP in the folding area FA2.

A buffer film CHL (refer to FIG. 6A) may be further disposed between the display module DM and the support plate SP. The buffer film CHL may include a polymer material. The buffer film CHL may absorb impacts applied thereto from the outside. The buffer film CHL may be coupled to each of the display module DM and the support plate SP by an adhesive film.

Figure 5A:
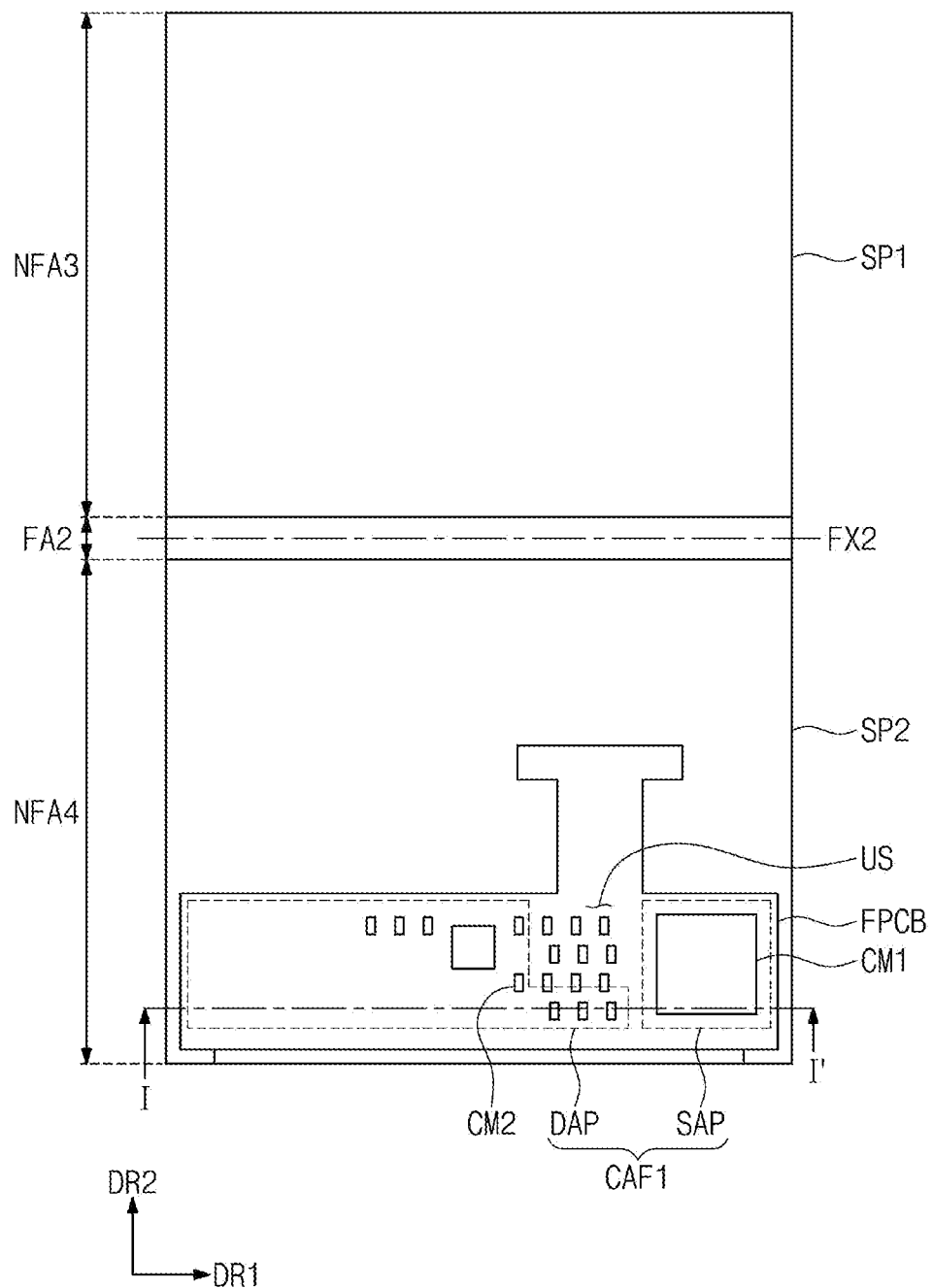
FIG. 5A is a rear view showing a display device according to an exemplary embodiment of the present inventive concept.
Figure 5B:
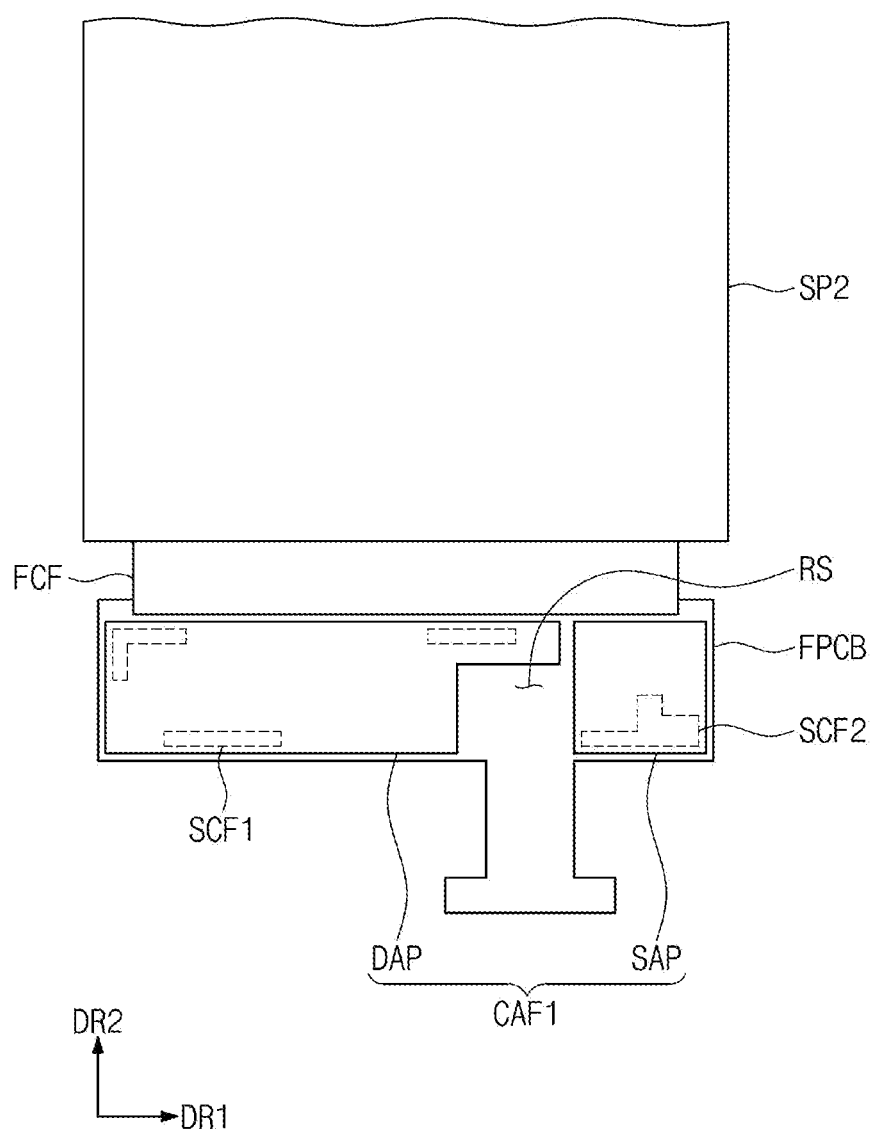
FIG. 5B is a rear view showing a second support plate and a circuit board shown in FIG. 5A.
Figure 6A:
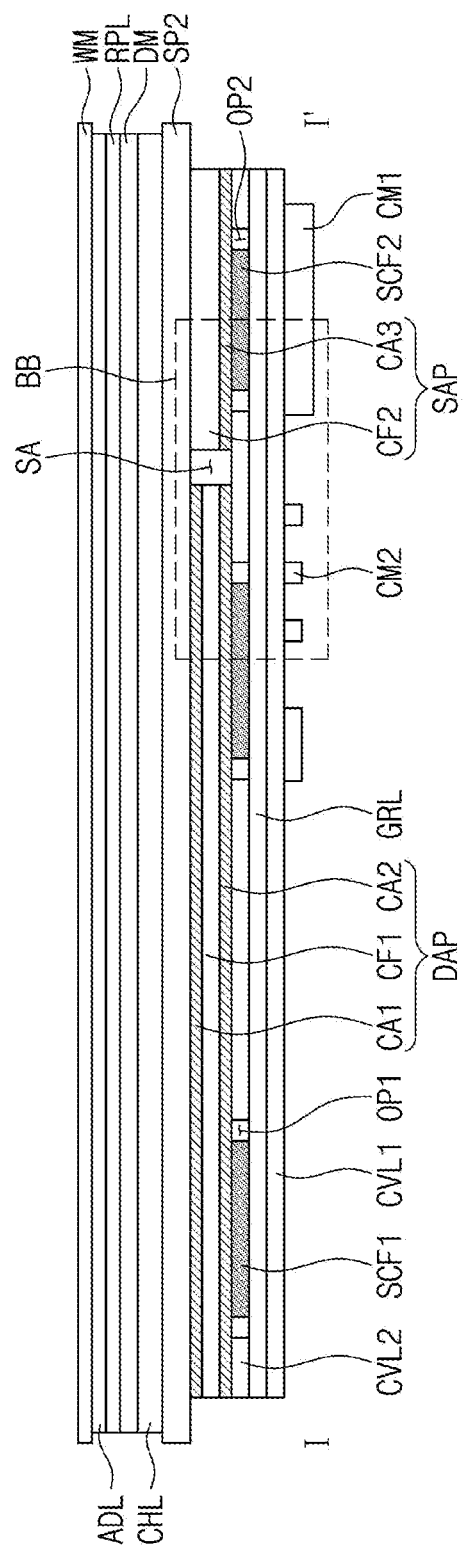
FIG. 6A is a cross-sectional view taken along a line I-I' shown in FIG. 5A.
Figure 6B:
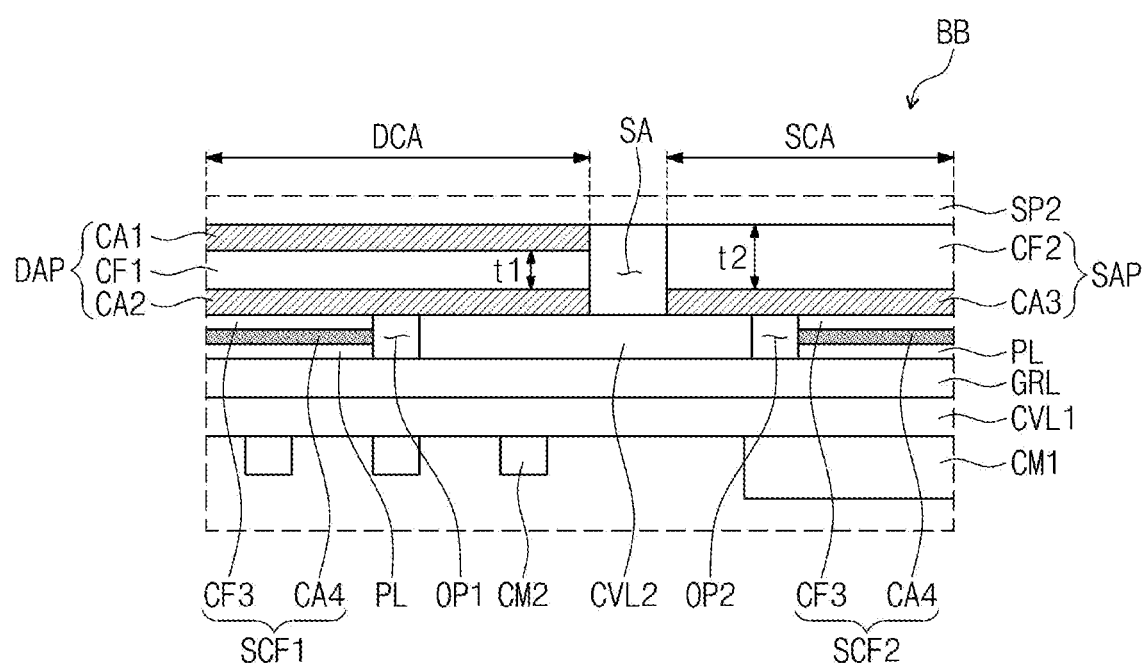
FIG. 6B is an enlarged view showing a portion BB shown in FIG. 6A.

FIG. 5A is a rear view showing the display device DD according to an exemplary embodiment of the present inventive concept, and FIG. 5B is a rear view showing the second support plate SP2 and the circuit board FPCB shown in FIG. 5A. FIG. 6A is a cross-sectional view taken along a line I-I' shown in FIG. 5A, and FIG. 6B is an enlarged view showing a portion BB shown in FIG. 6A.

Referring to FIGS. 4, 5A, and 6A, the support plate SP may be disposed on the rear surface of the display module DM. In the case where the display device DD is folded about the second folding axis FX2 extending in the first direction DR1, the support plate SP may include two support plates SP1 and SP2 spaced apart from each other in the second direction DR2. The first and second support plates SP1 and SP2 may be disposed to respectively correspond to the third and fourth non-folding areas NFA3 and NFA4.

The flexible circuit film FCF coupled to the display panel DP may be bent to surround a side surface of the display panel DP and the second support plate SP2, and the circuit board FPCB coupled to the flexible circuit film FCF may be placed on a rear surface of the second support plate SP2.

FIG. 5A shows a structure in which the circuit board FPCB is disposed on the rear surface of the second support plate SP2, however, the present inventive concept is not limited thereto. In other words, when the circuit board FPCB and the flexible circuit film FCF are connected to the display panel DP at the first support plate SP1, the circuit board FPCB may be placed on a rear surface of the first support plate SP1. In addition, when the support plate SP is formed in a single-plate shape, the circuit board FPCB may be placed on a rear surface of one side of the support plate SP.

The display device DD may further include a conductive adhesive film CAF1 to attach the circuit board FPCB to the second support plate SP2. Accordingly, the circuit board FPCB may be fixed to the rear surface of the second support plate SP2. In addition, a line, e.g., a ground line GRL (refer to FIG. 6A) of the circuit board FPCB may be electrically connected to the second support plate SP2 through the conductive adhesive film CAF1.

The conductive adhesive film CAF1 may include a double-sided adhesive film DAP and a single-sided adhesive film SAP. The double-sided adhesive film DAP and the single-sided adhesive film SAP may be spaced apart from each other when viewed in a plane. Therefore, a space SA may be provided between the double-sided adhesive film DAP and the single-sided adhesive film SAP.

The double-sided adhesive film DAP may be attached to each of the rear surface of the second support plate SP2 and a rear surface RS of the circuit board FPCB. The single-sided adhesive film SAP may be attached to one of the rear surface of the second support plate SP2 and the rear surface RS of the circuit board FPCB. As an example, the single-sided adhesive film SAP may be attached to the rear surface RS of the circuit board FPCB and not to the rear surface of the second support plate SP2.

The double-sided adhesive film DAP may include a first conductive film CF1, a first conductive adhesive CA1, and a second conductive adhesive CA2. The first conductive film CF1 may be a base film of the double-sided adhesive film DAP and may include a conductive fabric or a metal thin film. The first conductive adhesive CA1 may be disposed between the first conductive film CF1 and the rear surface of the second support plate SP2, and the second conductive adhesive CA2 may be disposed between the first conductive film CF1 and the rear surface RS of the circuit board FPCB. The first conductive adhesive CA1, the first conductive film CF1 and the second conductive adhesive CA2 may be sequentially stacked. Each of the first and second conductive adhesives CA1 and CA2 may include a conductive adhesive material. As an example, each of the first and second conductive adhesives CA1 and CA2 may be a film formed by distributing metal particles of gold, silver, platinum, nickel, copper, or carbon in a synthetic resin. The synthetic resin may include epoxy, silicon, polyimide, polyurethane, or the like.

The double-sided adhesive film DAP may be attached to each of the rear surface RS of the circuit board FPCB and the rear surface of the second support plate SP2 by the first and second conductive adhesives CA1 and CA2.

The single-sided adhesive film SAP may include a second conductive film CF2 and a third conductive adhesive CA3. The second conductive film CF2 may be a base film of the single-sided adhesive film SAP and may have an electrical conductivity. As an example, the second conductive film CF2 may include the same material as the first conductive film CF1. The third conductive adhesive CA3 may be disposed between the second conductive film CF2 and the rear surface RS of the circuit board FPCB. The third conductive adhesive CA3 may include a conductive adhesive material. As an example, the third conductive adhesive CA3 may include the same material as the first and second conductive adhesives CA1 and CA2. However, the third conductive adhesive CA3 may include a different material than the first and second conductive adhesives CA1 and CA2.

The single-sided adhesive film SAP may be attached to the circuit board FPCB by the third conductive adhesive CA3. However, an adhesive may not be disposed between the second conductive film CF2 and the rear surface of the second support plate SP2. Accordingly, the single-sided adhesive film SAP may not be fixed to the rear surface of the second support plate SP2. However, the second conductive film CF2 may be electrically connected to the second support plate SP2. For example, the second conductive film CF2 may be adjacent to the rear surface of the second support plate SP2.

The control chip, the passive elements, and the active elements may be mounted on an upper surface US of the circuit board FPCB. The rear surface RS of the circuit board FPCB may face the second support plate SP2, and the upper surface US of the circuit board FPCB may be opposite to the rear surface RS. The circuit board FPCB may include first and second circuit elements CM1 and CM2 mounted on the upper surface US of the circuit board FPCB. The first circuit element CM1 may have a size greater than that of the second circuit element CM2.

The first circuit element CM1 may be mounted on the upper surface US of the circuit board FPCB to correspond to the single-sided adhesive film SAP, and the second circuit element CM2 may be mounted on the upper surface US of the circuit board FPCB to correspond to the double-sided adhesive film DAP. In other words, the first circuit elements CM1 may be formed in an area overlapped with the single-sided adhesive film SAP and the second circuit elements CM2 may be formed in an area overlapped with the double-sided adhesive film DAP. Hereinafter, an area corresponding to the single-sided adhesive film SAP will be referred to as a single-sided adhesive area SCA, and an area corresponding to the double-sided adhesive film DAP will be referred to as a double-sided adhesive area DCA.

When the pressing occurs due to external force, the second support plate SP2 may be deformed. The deformation of the second support plate SP2 may be transferred to the circuit board FPCB and may cause a deformation of the circuit board FPCB. However, since the first circuit element CM1 is formed in the single-sided adhesive area SCA with a relatively large strength and a relatively large size, the circuit board FPCB may not be deformed even though the pressing occurs due to external force. When the deformed second support plate SP2 and the circuit board FPCB that is not deformed are coupled to each other, the adhesive may be repeatedly attached to and detached from the second support plate SP2, and noise may occur during such an action.

As shown in FIGS. 5A, 6A and 6B, the conductive adhesive may be omitted between the second conductive film CF2 and the second support plate SP2 in the single-sided adhesive area SCA on which the first circuit element CM1 is mounted. Accordingly, the conductive adhesive film CAF1 may not be fixed to the second support plate SP2 in the single-sided adhesive area SCA. In other words, the conductive adhesive film CAF1 may remain unattached to the second support plate SP2 in the area on which the first circuit element CM1 is mounted. For example, the conductive adhesive film CAF1 may be unattached but directly adjacent to the second support plate SP2 in the single-sided adhesive area SCA. Therefore, although the deformation occurs in the second support plate SP2, the conductive adhesive film CAF1 may not be repeatedly attached to and detached from the second support plate SP2, and as a result, the noise caused by attachment and detachment actions may be removed.

Referring to FIGS. 5B, 6A, and 6B, the circuit board FPCB may include the ground line GRL, cover layers CVL1 and CVL2, and step difference compensation films SCF1 and SCF2. The cover layers CVL1 and CVL2 may include first and second cover layers CVL1 and CVL2. The first and second cover layers CVL1 and CVL2 may include an insulating material. The first and second circuit elements CM1 and CM2 may be mounted on a first surface of the first cover layer CVL1. The upper surface US of the circuit board FPCB may be the first surface of the first cover layer CVL1. The ground line GRL may be disposed on a second surface of the first cover layer CVL1. The ground line GRL may be a copper line and may receive a ground voltage.

The ground line GRL may be covered by the second cover layer CVL2. The second cover layer CVL2 may be provided with openings OP1 and OP2 through which a portion of the ground line GRL is exposed. The openings OP1 and OP2 may include a first opening OP1 in the double-sided adhesive area DCA to expose the ground line GRL and a second opening OP2 in the single-sided adhesive area SCA to expose the ground line GRL. The first and second openings OP1 and OP2 may be voids.

Other lines may be disposed on the second surface of the first cover layer CVL1 in addition to the ground line GRL.

The step difference compensation films SCF1 and SCF2 may include first and second step difference compensation films SCF1 and SCF2. The first step difference compensation film SCF1 may be in the double-sided adhesive area DCA to correspond to the first opening OP1, and the second step difference compensation film SCF2 may be in the single-sided adhesive area SCA to correspond to the second opening OP2. For example, the first step difference compensation film SCF1 may be disposed in the first opening OP1 and the second step difference compensation film SCF2 may be disposed in the second opening OP2. The first and second step difference compensation films SCF1 and SCF2 may be electrically connected to the ground line GRL and may compensate for a step difference between the second cover layer CVL2 and the ground line GRL, which is caused by the first and second openings OP1 and OP2.

The first and second step difference compensation films SCF1 and SCF2 may be disposed at different positions from each other but may have the same structure as each other. Accordingly, the first step difference compensation film SCF1 will be described as a representative example, and detailed descriptions of the second step difference compensation film SCF2 will be omitted.

The first step difference compensation film SCF1 may include a third conductive film CF3 and a fourth conductive adhesive CA4. The third conductive film CF3 may be a base film of the first step difference compensation film SCF1 and may have a thickness appropriate to compensate for the step difference between the second cover layer CVL2 and the fourth conductive adhesive CA4. The third conductive film CF3 may include a material with an electrical conductivity. As an example, the third conductive film CF3 may include the same material as the first and second conductive films CF1 and CF2. The fourth conductive adhesive CA4 may be disposed between the third conductive film CF3 and the ground line GRL. The fourth conductive adhesive CA4 may include a conductive adhesive material. As an example, the fourth conductive adhesive CA4 may include the same material as the first, second, and third conductive adhesives CA1, CA2, and CA3.

As an example, the circuit board FPCB may further include a protective metal layer PL that covers at least one area of the portion of the ground line GRL exposed through the first and second openings OP1 and OP2. The protective metal layer PL may be provided to prevent the ground line GRL from being oxidized or corroded. As an example, the protective metal layer PL may include a metal material of gold (Au) or the like that is resistant to oxidation and corrosion.

When the protective metal layer PL is provided, the first and second step difference compensation films SCF1 and SCF2 may be attached to the protective metal layer PL by the fourth conductive adhesive CA4. When the protective metal layer PL is omitted, the first and second step difference compensation films SCF1 and SCF2 may be attached directly to the ground line GRL.

The third conductive film CF3 of the first step difference compensation film SCF1 may be attached to the second conductive adhesive CA2 of the double-sided adhesive film DAP, and the third conductive film CF3 of the second step difference compensation film SCF2 may be attached to the third conductive adhesive CA3 of the single-sided adhesive film SAP. Accordingly, the double-sided adhesive film DAP may be electrically connected to the ground line GRL through the first step difference compensation film SCF1, and the single-sided adhesive film SAP may be electrically connected to the ground line GRL through the second step difference compensation film SCF2. Thus, a first electrostatic path, which is formed when the second support plate SP2 and the ground line GRL are electrically connected to each other through the first step difference compensation film SCF1 and the double-sided adhesive film DAP, may be provided in the double-sided adhesive area DCA. In addition, a second electrostatic path, which is formed when the second support plate SP2 and the ground line GRL are electrically connected to each other through the second step difference compensation film SCF2 and the single-sided adhesive film SAP, may be provided in the single-sided adhesive area SCA.

Accordingly, when a static electricity occurs in the circuit board FPCB, the static electricity may be discharged through the first and second electrostatic paths, and as a result, the circuit elements or the signal lines mounted on the circuit board FPCB may be prevented from being damaged due to the static electricity.

Referring to FIG. 6B, the second conductive film CF2 may have a thickness t2 greater than a thickness t1 of the first conductive film CF1. For example, the thickness t2 of the second conductive film CF2 may be equal to a sum of the thickness t1 of the first conductive film CF1 and a thickness of the first conductive adhesive CA1, however, it is not limited thereto. In other words, the thickness t2 of the second conductive film CF2 may be smaller than the sum of the thickness t1 of the first conductive film CF1 and the thickness of the first conductive adhesive CA1.

Figure 7A:
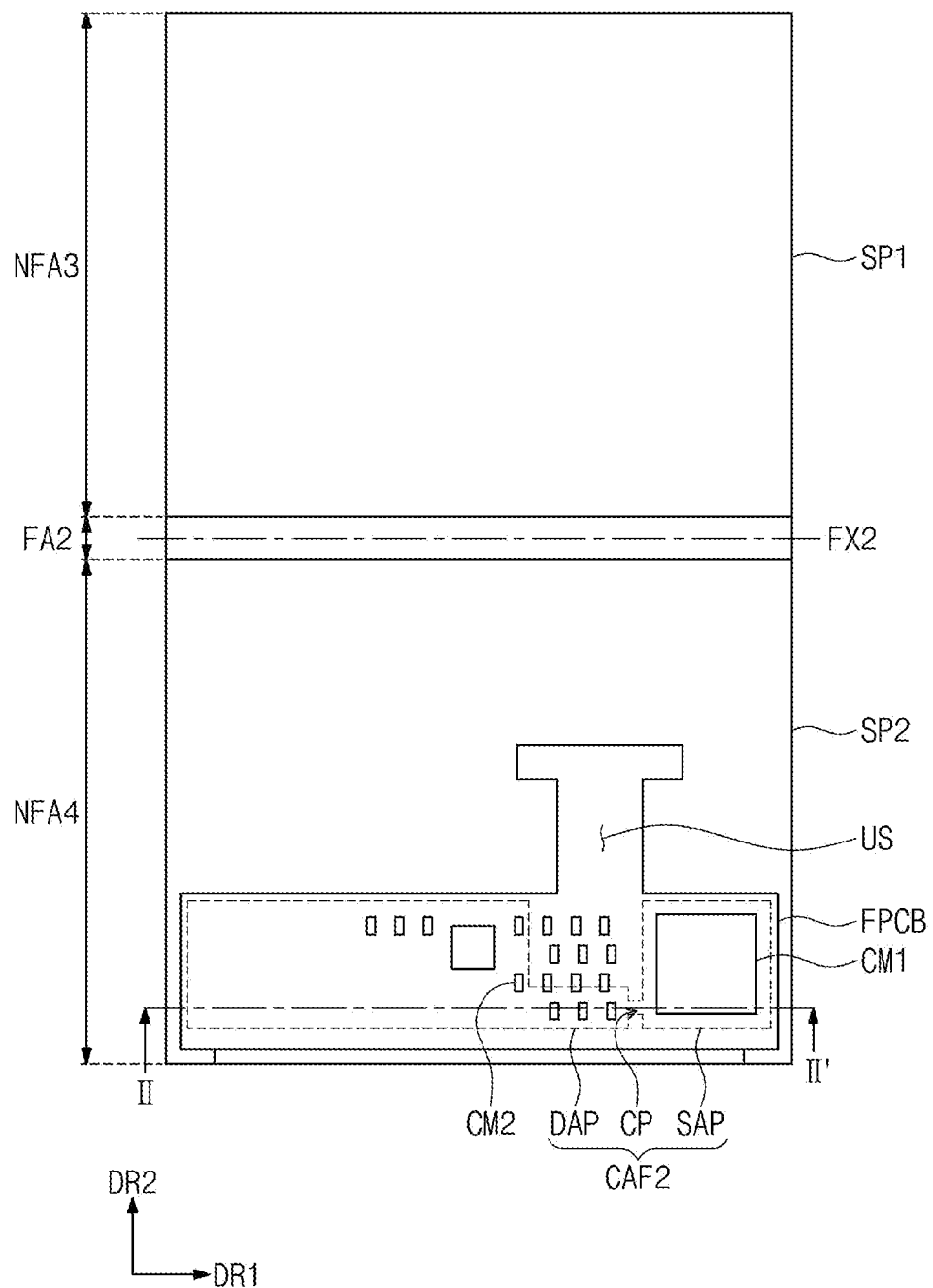
FIG. 7A is a rear view showing a display device according to an exemplary embodiment of the present inventive concept.
Figure 7B:
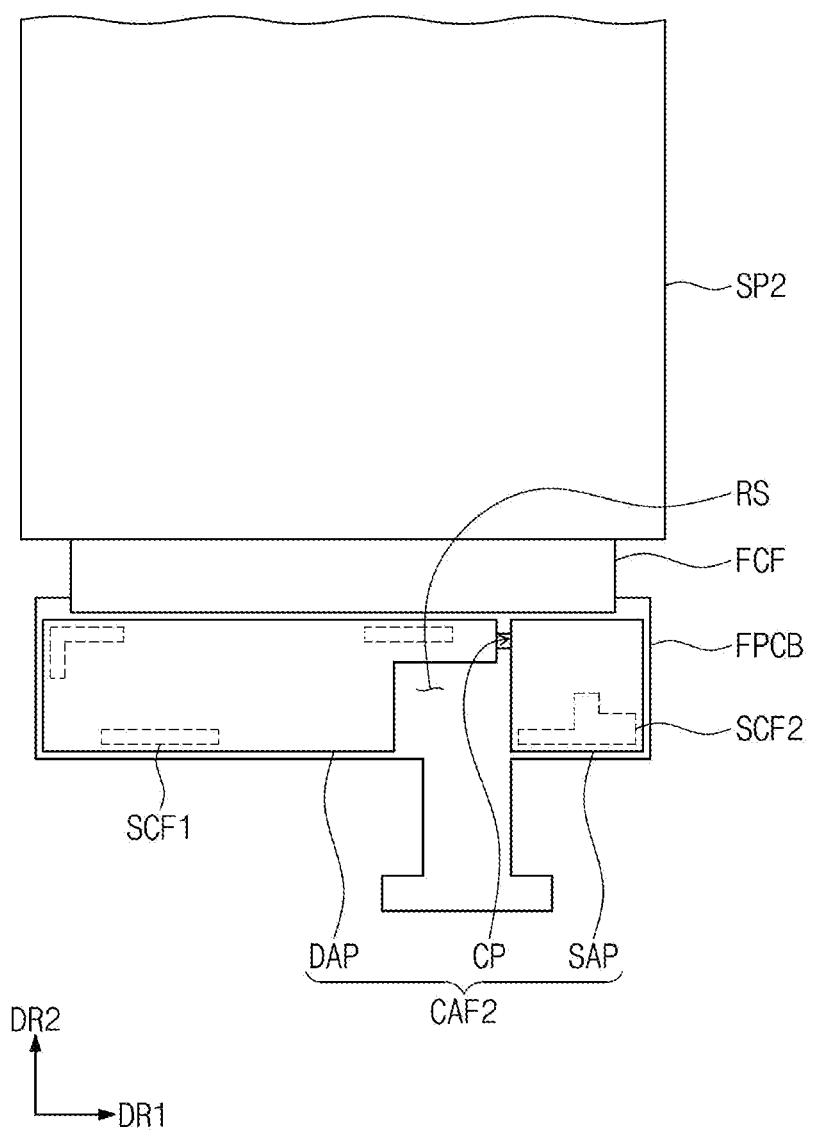
FIG. 7B is a rear view showing a second support plate and a circuit board shown in FIG. 7A.
Figure 8A:
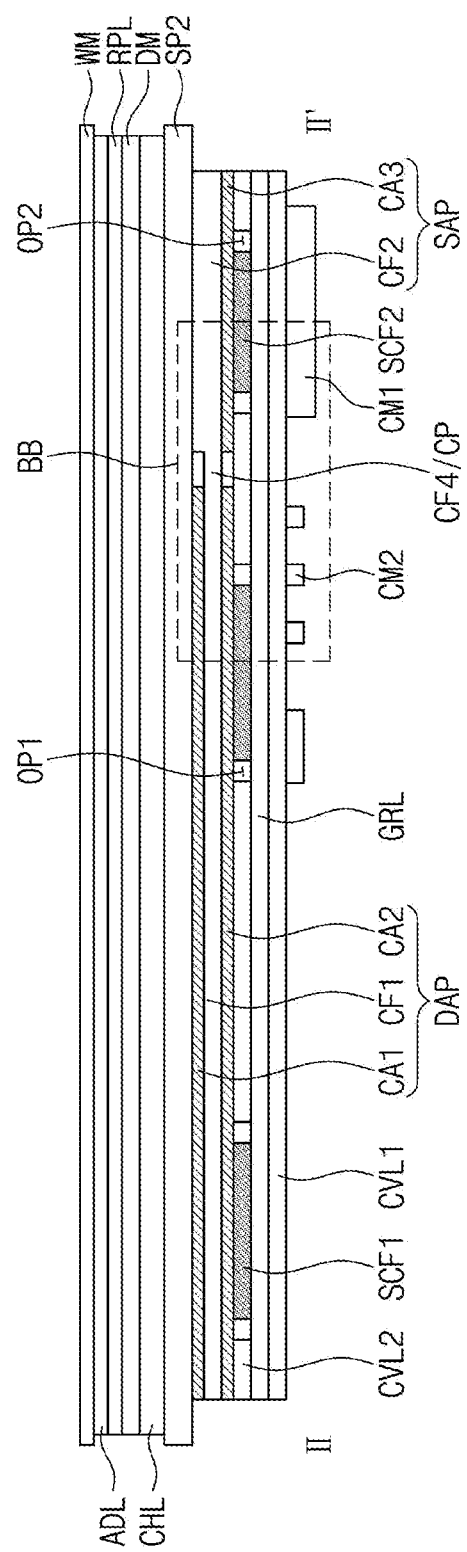
FIG. 8A is a cross-sectional view taken along a line II-II' shown in FIG. 7A.
Figure 8B:
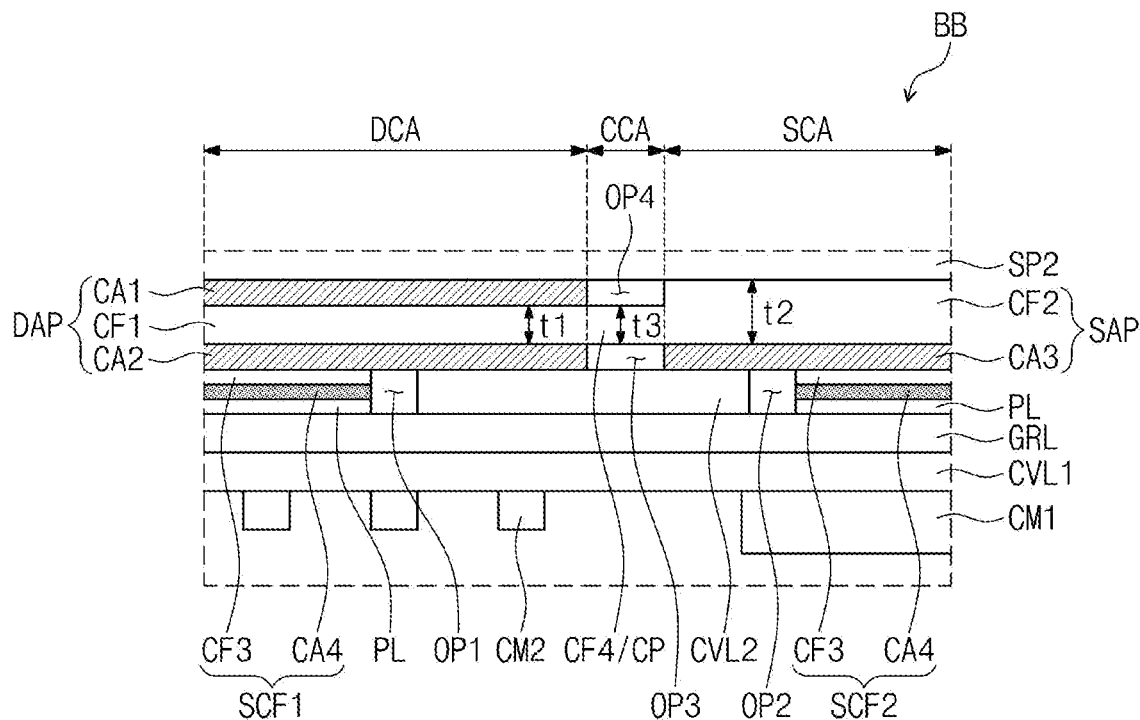
FIG. 8B is an enlarged view showing a portion BB shown in FIG. 8A.
Figure 8C:
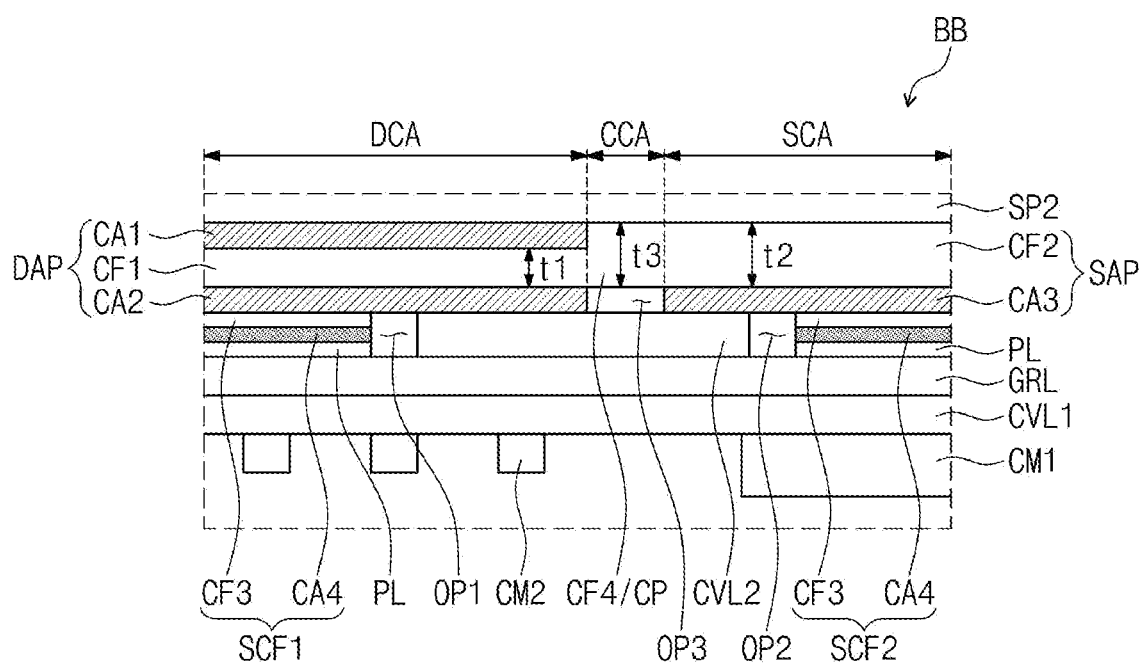
FIG. 8C is an enlarged view showing a portion BB shown in FIG. 8A according to an another exemplary embodiment of the inventive concept.

FIG. 7A is a rear view showing a display device DD according to an exemplary embodiment of the present inventive concept, and FIG. 7B is a rear view showing a second support plate SP2 and a circuit board FPCB shown in FIG. 7A. FIG. 8A is a cross-sectional view taken along a line II-II' shown in FIG. 7A, FIG. 8B is an enlarged view showing a portion BB shown in FIG. 8A and FIG. 8C is an enlarged view showing a portion BB shown in FIG. 8A according to an another exemplary embodiment of the inventive concept. In FIGS. 7A, 7B, 8A, 8B and 8C, the same reference numerals may denote the same elements in FIGS. 5A, 5B, 6A, and 6B, and thus, detailed descriptions of the same elements may be omitted to avoid redundancy.

Referring to FIGS. 4, 7A to 8C, a conductive adhesive film CAF2 may include a double-sided adhesive film DAP, a single-sided adhesive film SAP, and a connection portion CP connecting the double-sided adhesive film DAP and the single-sided adhesive film SAP. The double-sided adhesive film DAP and the single-sided adhesive film SAP may be spaced apart from each other when viewed in a plane. Accordingly, a space may be provided between the double-sided adhesive film DAP and the single-sided adhesive film SAP. The connection portion CP may be disposed in the space and may connect the double-sided adhesive film DAP and the single-sided adhesive film SAP. An area of the space in which the connection portion CP is disposed may be referred to as a connection area CCA. The connection portion CP may be located between a first circuit element CM1 and a second circuit element CM2.

In the present exemplary embodiment, descriptions of the double-sided adhesive film DAP and the single-sided adhesive film SAP are similar to those described with reference to FIGS. 5A to 6B, and thus, details thereof may be omitted.

The connection portion CP may include a fourth conductive film CF4. The connection portion CP may include a fourth conductive film CF4 that is integrally formed with a first conductive film CF1 of the double-sided adhesive film DAP and a second conductive film CF2 of the single-sided adhesive film SAP. The fourth conductive film CF4 may have the same thickness as one of the first and second conductive films CF1 and CF2.

As shown in FIG. 8B, the fourth conductive film CF4 may have a thickness t3 that is equal to a thickness t1 of the first conductive film CF1, however, it is not limited thereto. In other words, as shown in FIG. 8C, the fourth conductive film CF4 may have a thickness t3 that is equal to the thickness t2 of the second conductive film CF2. FIG. 8B further shows that the fourth conductive film CF4 is overlapped by a pair of openings OP3 and OP4, one opening OP3 between the second conductive adhesive CA2 and the third conductive adhesive CA3, the other opening OP4 between the first conductive adhesive CA1 and the second conductive film CF2. FIG. 8C shows just one opening OP3 between the second conductive adhesive CA2 and the third conductive adhesive CA3.

The double-sided adhesive film DAP and the single-sided adhesive film SAP may be electrically connected to each other through the fourth conductive film CF4 of the connection portion CP. When the second support plate SP2 is deformed due to external force, the second conductive film CF2 may not be in contact with a rear surface of the second support plate SP2. In this case, a second electrostatic path, which is formed when the second support plate SP2 is electrically connected to the ground line GRL through the single-sided adhesive film SAP, may not be provided. When the second electrostatic path is not formed, the double-sided adhesive film DAP and the single-sided adhesive film SAP may be electrically connected to each other through the connection portion CP to enhance the electrostatic discharge function. As described above, when the double-sided adhesive film DAP and the single-sided adhesive film SAP are electrically connected to each other through the connection portion CP, an electrostatic path may be provided between the second support plate SP2 and the ground line GRL, which are electrically connected to each other through the single-sided adhesive film SAP, the connection portion CP, and the double-sided adhesive film DAP.

When the connection portion CP is provided on the conductive adhesive film CAF2, the ability of the display device DD to perform the electrostatic discharge function increased.

FIGS. 7A to 8C show a structure in which the connection portion CP includes only the fourth conductive film CF4, however, the present inventive concept is not limited thereto. In other words, the connection portion CP may further include at least one of a conductive adhesive disposed between the fourth conductive film CF4 and the circuit board FPCB and a conductive adhesive disposed between the fourth conductive film CF4 and the second support plate SP2.

FIGS. 5A to 7B show the structure in which the single-sided adhesive film SAP is disposed adjacent to one short side of the circuit board FPCB, however, the present inventive concept is not limited thereto. In other words, a position of the single-sided adhesive film SAP may be changed depending on a position of a first circuit element CM1. For example, the single-sided adhesive film SAP may be moved to overlap the first circuit element CM1 when the first circuit element CM1 is moved.

Figure 9A:
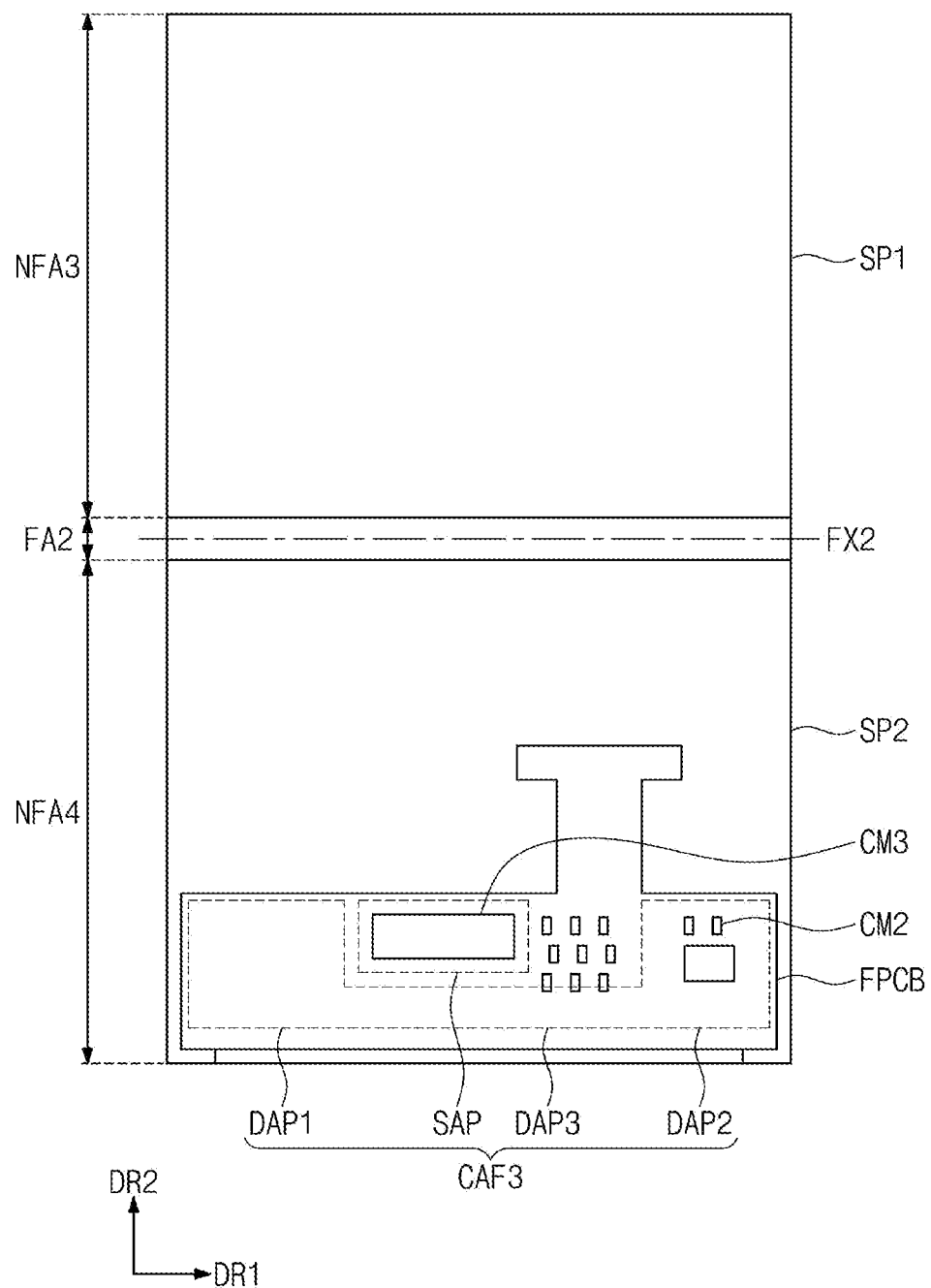
FIG. 9A is a rear view showing a display device according to an exemplary embodiment of the present inventive concept.
Figure 9B:
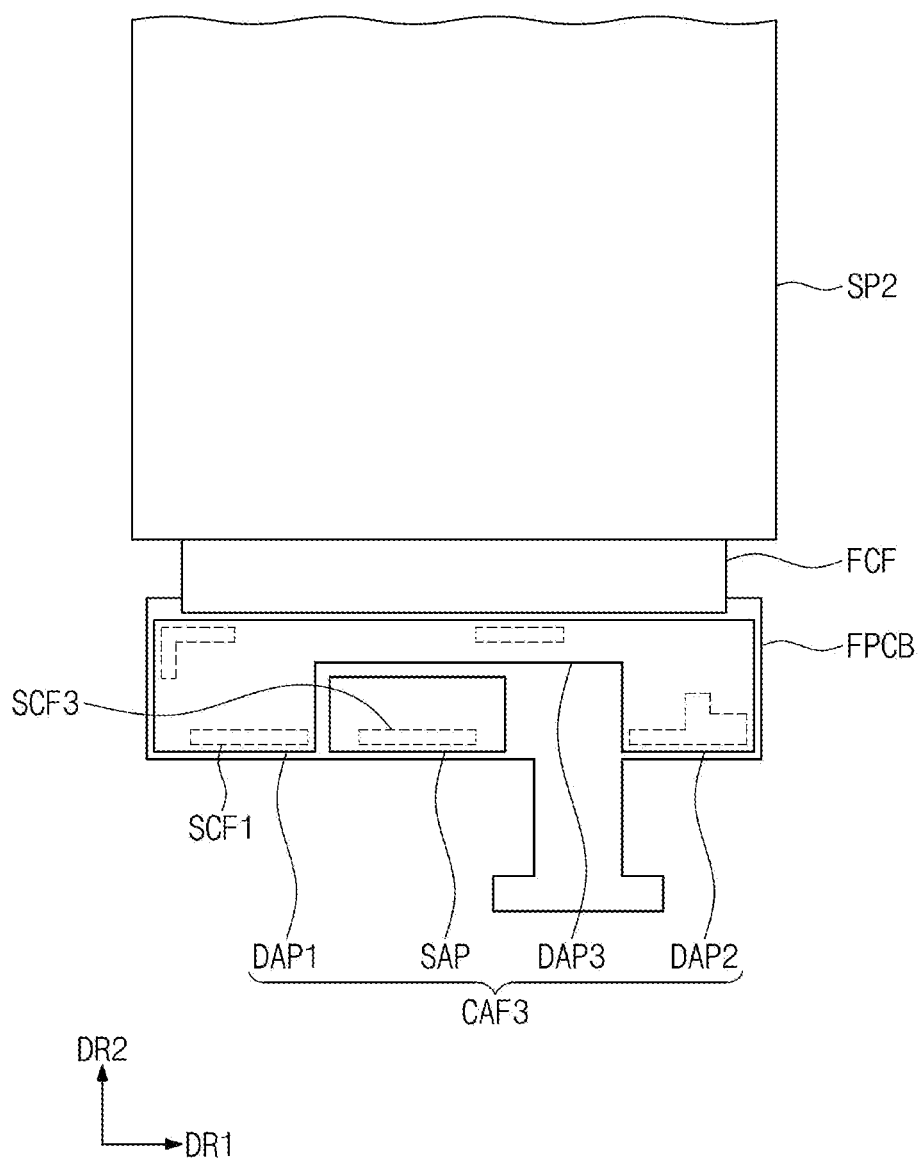
FIG. 9B is a rear view showing a second support plate and a circuit board shown in FIG. 9A.

FIG. 9A is a rear view showing a display device DD according to an exemplary embodiment of the present inventive concept, and FIG. 9B is a rear view showing a second support plate SP2 and a circuit board FPCB shown in FIG. 9A. In FIGS. 9A and 9B, the same reference numerals may denote the same elements in FIGS. 5A and 5B, and thus, detailed descriptions of the same elements may be omitted.

Referring to FIGS. 4, 9A, and 9B, a conductive adhesive film CAF3 may include a first double-sided adhesive film DAP1, a second double-sided adhesive film DAP2, a third double-sided adhesive film DAP3, and a single-sided adhesive film SAP. The first and second double-sided adhesive films DAP1 and DAP2 may be disposed adjacent to opposite short sides of the circuit board FPCB, and the third double-sided adhesive film DAP3 may be disposed adjacent to one long side of the circuit board FPCB. The first, second, and third double-sided adhesive films DAP1, DAP2, and DAP3 may be integrally formed with each other and may have a single-film shape. In other words, the first, second, and third double-sided adhesive films DAP1, DAP2, and DAP3 may be a single film.

The single-sided adhesive film SAP may be disposed adjacent to the other long side of the circuit board FPCB. For example, the other long side of the circuit board FPCB closer to the folding area FA2. The single-sided adhesive film SAP may be disposed between the first and second double-sided adhesive films DAP1 and DAP2. The single-sided adhesive film SAP may be spaced apart from the first to third double-sided adhesive films DAP1 to DAP3.

The circuit board FPCB may include a first circuit element CM3 mounted in an area corresponding to the single-sided adhesive film SAP and a second circuit element CM2 mounted in an area corresponding to at least one of the first to third double-sided adhesive films DAP1 to DAP3. The first circuit element CM3 may have a size greater than a size of the second circuit element CM2.

In the present exemplary embodiment, a configuration of each of the first to third double-sided adhesive films DAP1 to DAP3 is similar to that of the double-sided adhesive film DAP described with reference to FIGS. 5A, 5B. 6A, 6B, 7A, 7B, and 8A to 8C, and thus, details thereof may be omitted. Similarly, a configuration of the single-sided adhesive film SAP is similar to that of the single-sided adhesive film SAP described with reference to FIGS. 5A, 5B, 6A, 6B, 7A, 7B, and 8A to 8C, and thus, details thereof may be omitted.

The circuit board FPCB may include a first step difference compensation film SCF1 to electrically connect the ground line GRL (refer to FIG. 6A) to the first to third double-sided adhesive films DAP1 to DAP3 and a second step difference compensation film SCF3 to electrically connect the single-sided adhesive film SAP to the ground line GRL. The first step difference compensation film SCF1 may overlap at least one of the first to third double-sided adhesive films DAP1 to DAP3 and may be directly in contact with one of the first to third double-sided adhesive films DAP1 to DAP3. The second step difference compensation film SCF3 may overlap the single-sided adhesive film SAP and may be directly in contact with the single-sided adhesive film SAP.

FIGS. 9A and 9B show a structure in which a mounting position of the first circuit element CM3 is changed. In other words, when compared with FIGS. 5A and 5B, the shape and the location of the first circuit element CM3 (CM1 in FIGS. 5A and 5B) are changed, and thus, the conductive adhesive film CAF3 shown in FIGS. 9A and 9B has the shape different from that of the conductive adhesive film CAF1 shown in FIGS. 5A and 5B. However, the structure and the function of the conductive adhesive film CAF3 may be substantially the same as those of the conductive adhesive film CAF1.

Figure 10A:
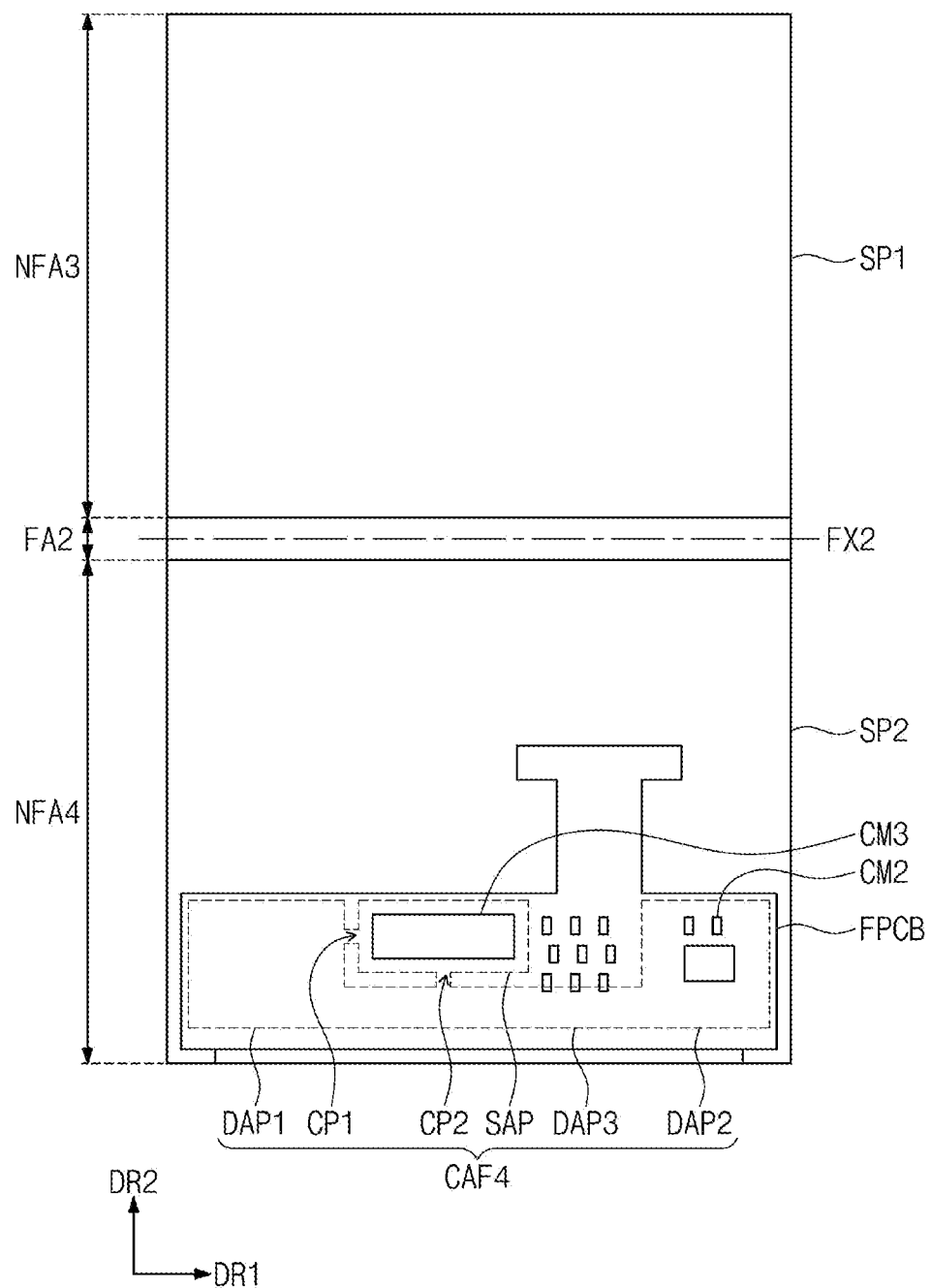
FIG. 10A is a rear view showing a display device according to an exemplary embodiment of the present inventive concept.
Figure 10B:
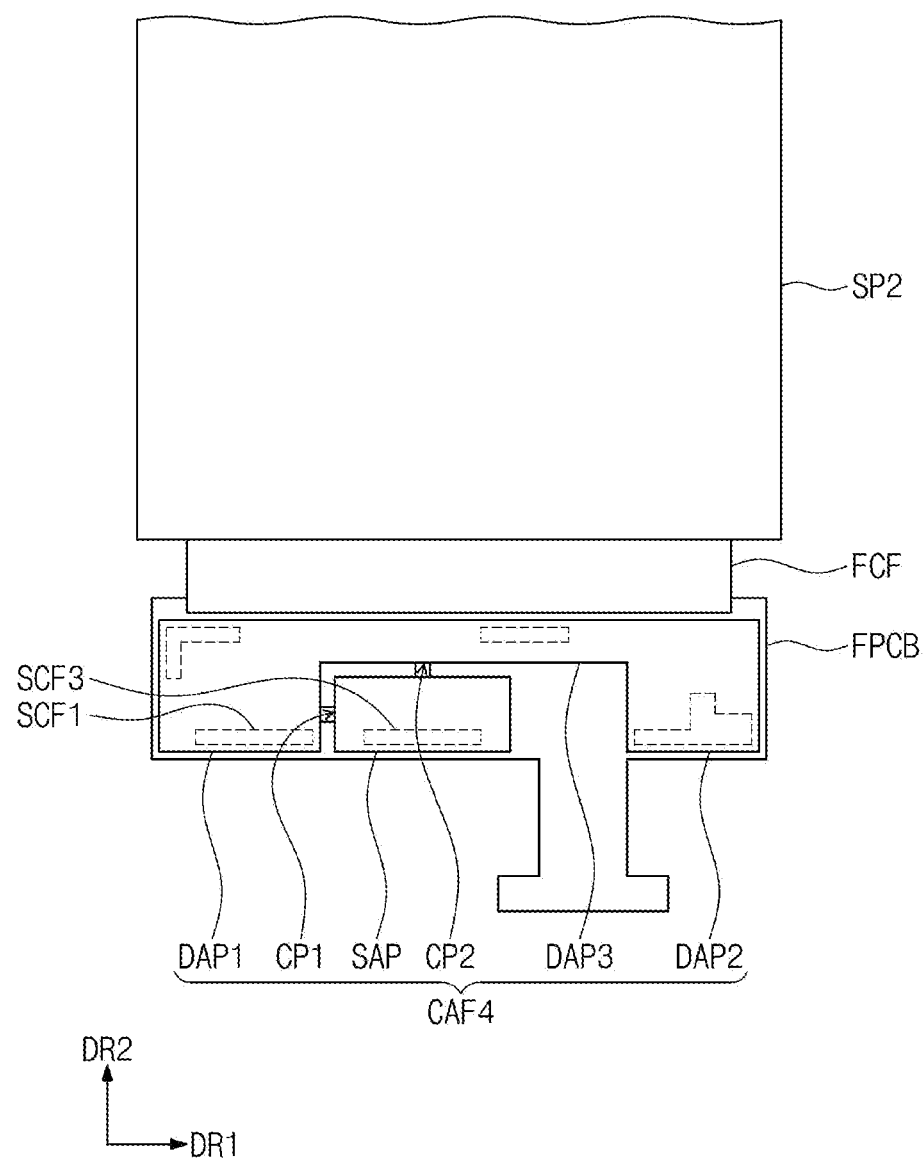
FIG. 10B is a rear view showing a second support plate and a circuit board shown in FIG. 10A.

FIG. 10A is a rear view showing a display device DD according to an exemplary embodiment of the present inventive concept, and FIG. 10B is a rear view showing a second support plate SP2 and a circuit board FPCB shown in FIG. 10A.

Referring to FIGS. 4, 10A, and 10B, a conductive adhesive film CAF4 may include first, second, and third double-sided adhesive films DAP1, DAP2, and DAP3, a single-sided adhesive film SAP, and first and second connection portions CP1 and CP2. The first to third double-sided adhesive films DAP1 to DAP3 and the single-sided adhesive film SAP may be spaced apart from each other when viewed in a plane. Accordingly, a space may be provided between the first to third double-sided adhesive films DAP1 to DAP3 and the single-sided adhesive film SAP. The first connection portion CP1 may be disposed in the space to connect the first double-sided adhesive film DAP1 to the single-sided adhesive film SAP, and the second connection portion CP2 may be disposed in the space to connect the third double-sided adhesive film DAP3 to the single-sided adhesive film SAP.

FIGS. 10A and 10B show a structure in which the conductive adhesive film CAF4 includes two connection portions CP1 and CP2, however, the present inventive concept is not limited thereto. In other words, the conductive adhesive film CAF4 may include one or three or more connection portions.

Each of the first and second connection portions CP1 and CP2 may have the same configuration as that of the connection portion CP shown in FIGS. 7A to 8C. Accordingly, detailed descriptions of the first and second connection portions CP1 and CP2 may be omitted.

As described above, even when the single-sided adhesive film SAP is not in contact with the second support plate SP2, an electrostatic path may be provided between the second support plate SP2 and the ground line GRL via a second step difference compensation film SCF3 since the first and third double-sided adhesive films DAP1 and DAP3 are electrically connected to the single-sided adhesive film SAP through the first and second connection portions CP1 and CP2. Accordingly, when the conductive adhesive film CAF4 includes the first and second connection portions CP1 and CP2, the display device DD may have enhanced electrostatic discharge characteristics.

Figure 11A:
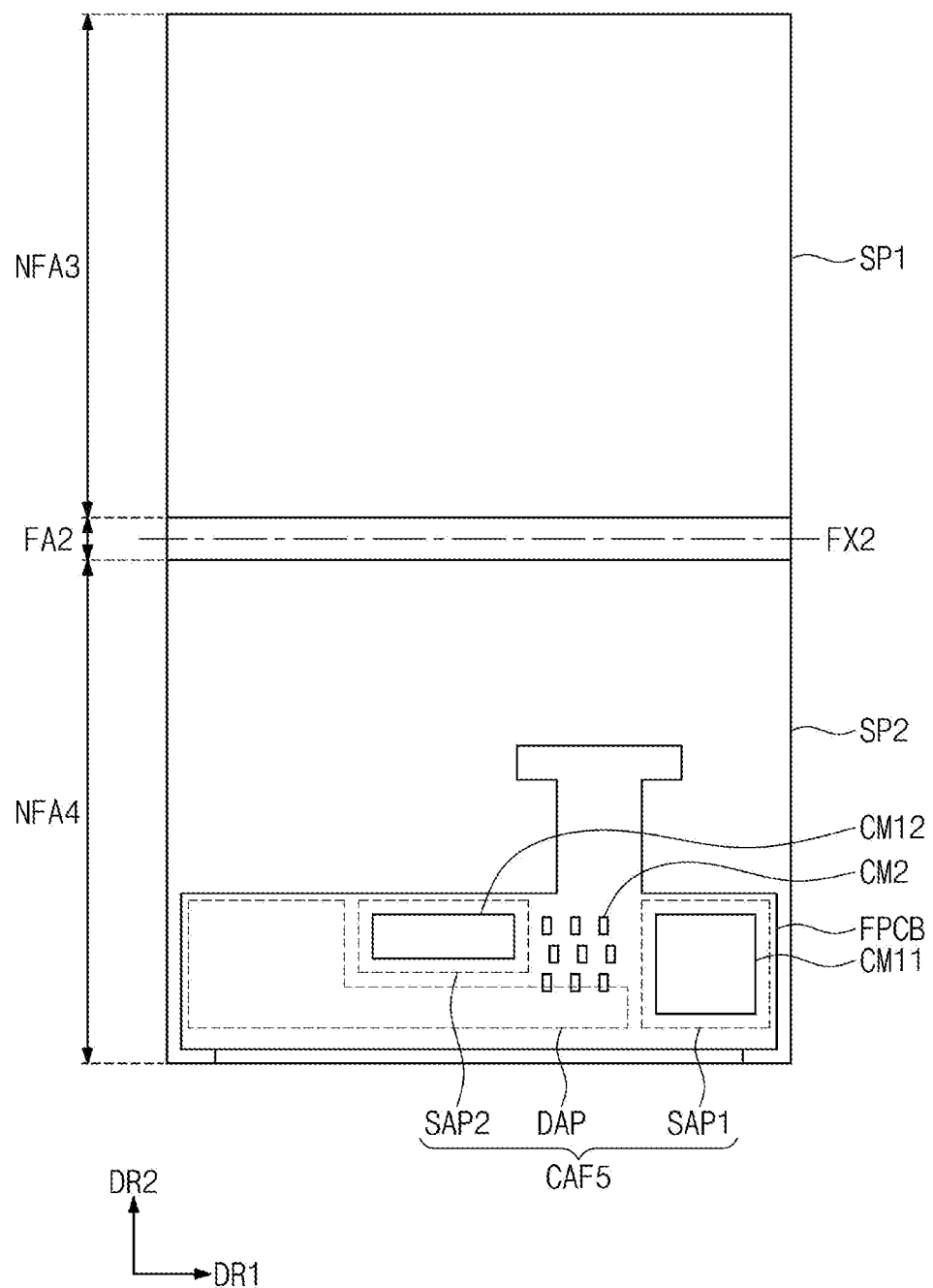
FIG. 11A is a rear view showing a display device according to an exemplary embodiment of the present inventive concept.
Figure 11B:
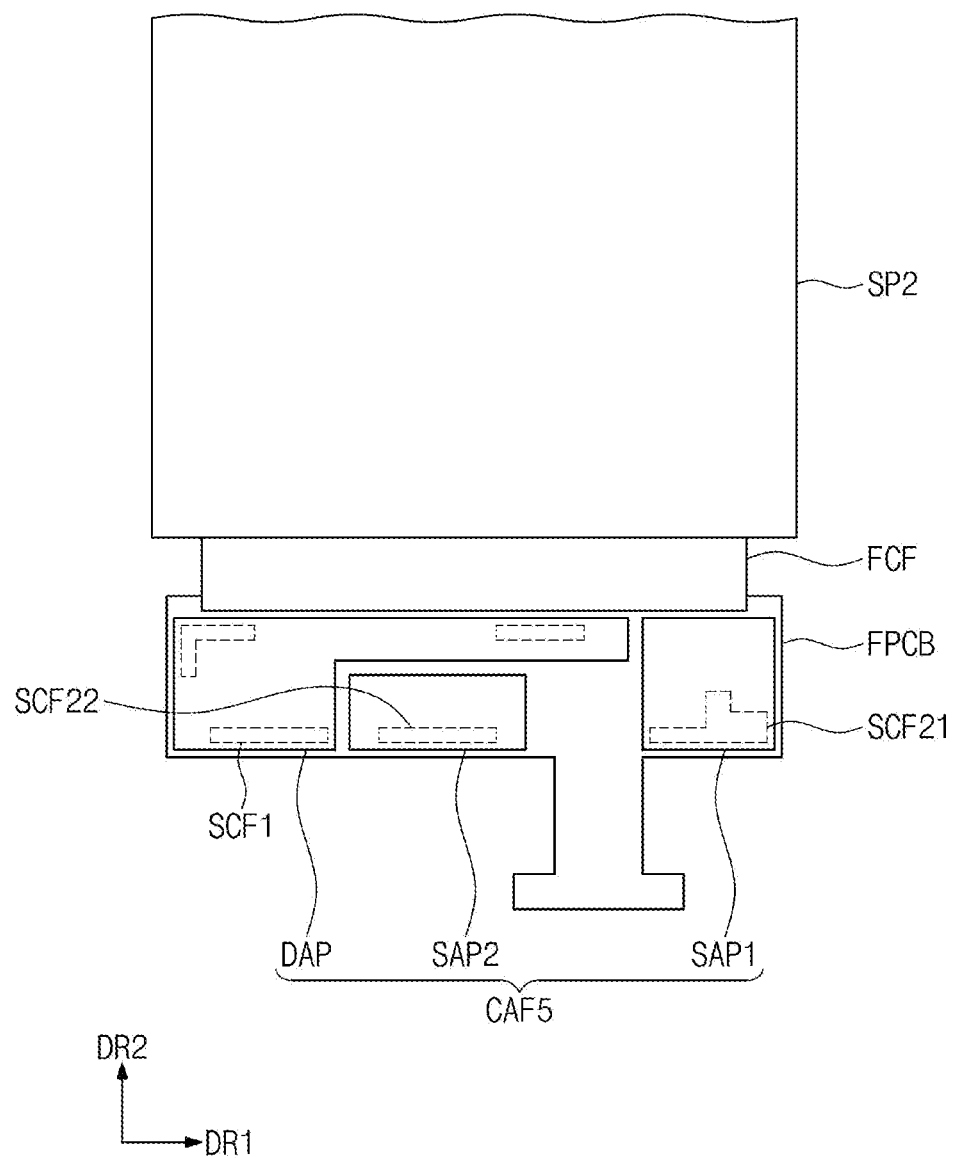
FIG. 11B is a rear view showing a second support plate and a circuit board shown in FIG. 11A.

FIG. 11A is a rear view showing a display device DD according to an exemplary embodiment of the present inventive concept, and FIG. 11B is a rear view showing a second support plate SP2 and a circuit board FPCB shown in FIG. 11A.

Referring to FIGS. 4, 11A, and JI B, a conductive adhesive film CAF5 may include a double-sided adhesive film DAP, a first single-sided adhesive film SAP1, and a second single-sided adhesive film SAP2.

The circuit board FPCB may include a first circuit element CM11 mounted in an area corresponding to the first single-sided adhesive film SAP1, a second circuit element CM2 mounted to overlap the double-sided adhesive film DAP, and a third circuit element CM12 mounted in an area corresponding to the second single-sided adhesive film SAP2. The first and third circuit elements CM11 and CM12 may have a size greater than that of the second circuit element CM2.

In the present exemplary embodiment, since a configuration of the double-sided adhesive film DAP is similar to that of the double-sided adhesive film DAP described with reference to FIGS. 5A to 8C, details thereof may be omitted. Similarly, since a configuration of each of the first and second single-sided adhesive films SAP1 and SAP2 is similar to that of the single-sided adhesive film SAP described with reference to FIGS. 5A to 8C, details thereof may be omitted.

The circuit board FPCB may include a first step difference compensation film SCF1 that electrically connects the ground line GRL (refer to FIG. 6A) to the double-sided adhesive film DAP, a second step difference compensation film SCF21 that electrically connects the first single-sided adhesive film SAP1 to the ground line GRL, and a third step difference compensation film SCF22 that electrically connects the second single-sided adhesive film SAP2 to the ground line GRL. The first step difference compensation film SCF1 may overlap the double-sided adhesive film DAP and may be in contact directly with the double-sided adhesive film DAP. The second step difference compensation film SCF21 may overlap the first single-sided adhesive film SAP1 and may be in contact directly with the first single-sided adhesive film SAP1. The third step difference compensation film SCF22 may overlap the second single-sided adhesive film SAP2 and may be in contact directly with the second single-sided adhesive film SAP2.

FIGS. 11A and 11B show an example of using two single-sided adhesive films SAP1 and SAP2 when two large-sized circuit elements CM11 and CM12 are spaced apart from each other on the circuit board FPCB. In other words, the number of the single-sided adhesive films is changed when compared with FIGS. 5A and 5B, however, the conductive adhesive film CAF5 shown in FIGS. 11A and 11B may have a function substantially similar to that of the conductive adhesive film CAF1 shown in FIGS. 5A and 5B.

Figure 12A:
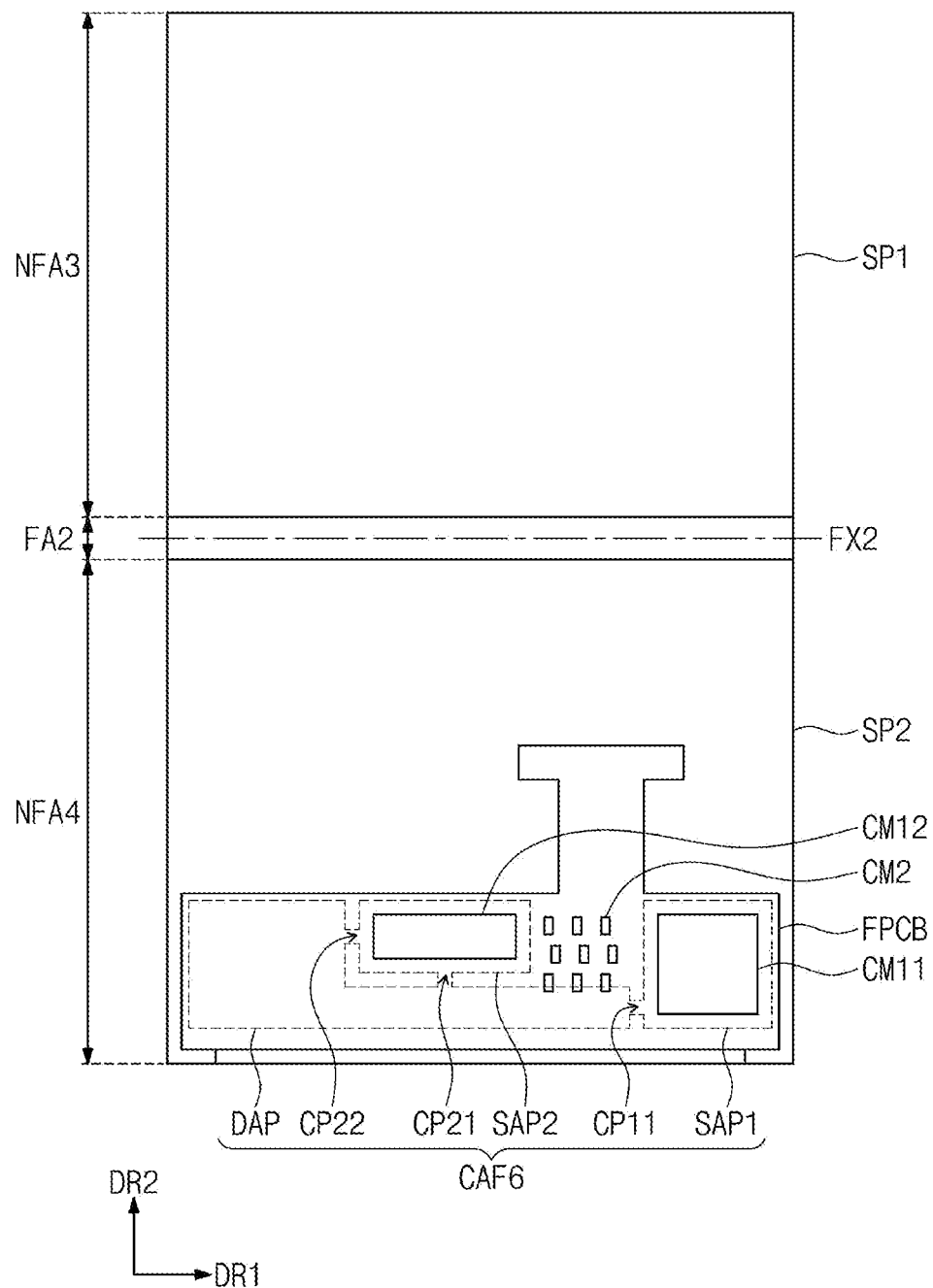
FIG. 12A is a rear view showing a display device according to an exemplary embodiment of the present inventive concept.
Figure 12B:
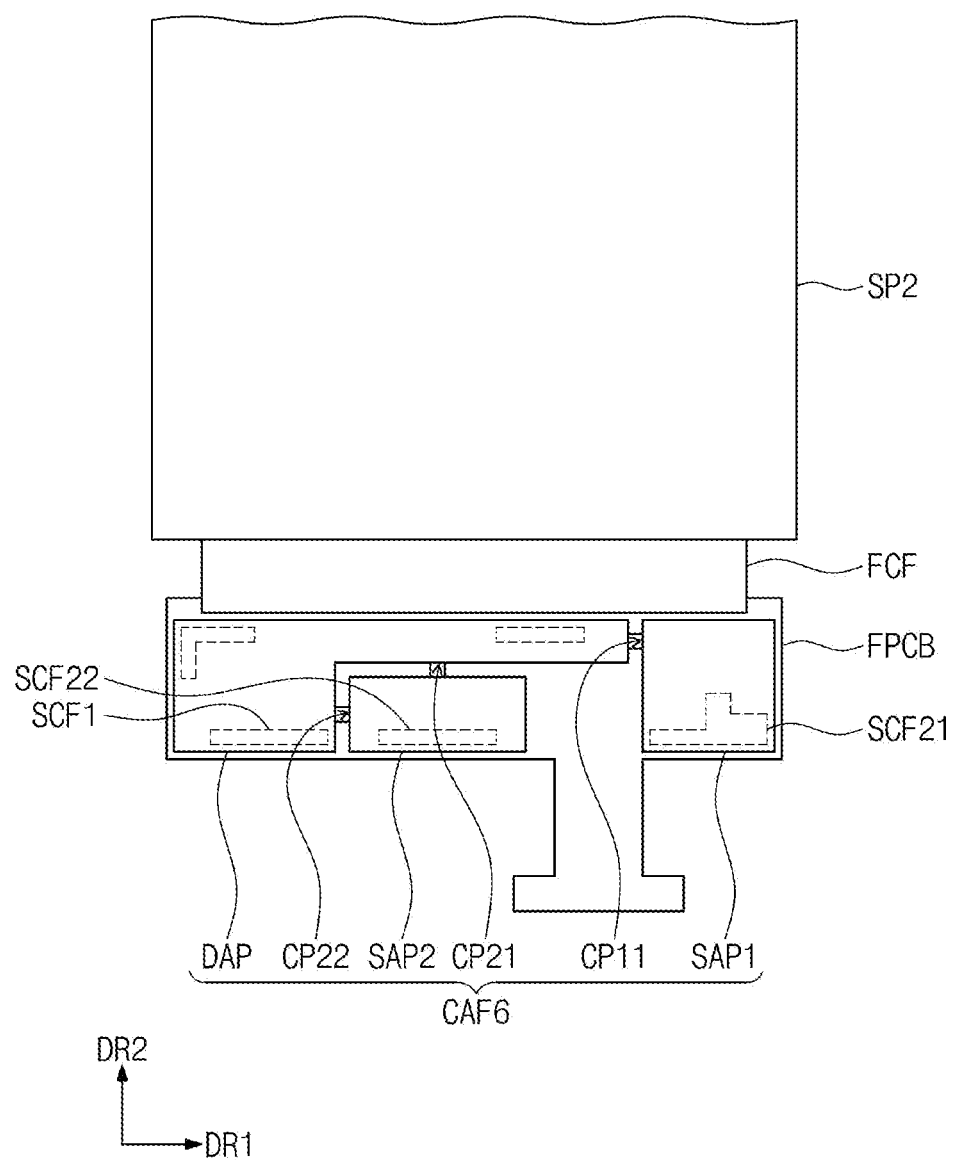
FIG. 12B is a rear view showing a second support plate and a circuit board shown in FIG. 12A.

FIG. 12A is a rear view showing a display device DD according to an exemplary embodiment of the present inventive concept, and FIG. 12B is a rear view showing a second support plate SP2 and a circuit board FPCB shown in FIG. 12A.

Referring to FIGS. 4, 12A, and 12B, a conductive adhesive film CAF6 may include a double-sided adhesive film DAP, first and second single-sided adhesive films SAP1 and SAP2, and first, second, and third connection portions CP11, CP21, and CP22. The first and second single-sided adhesive films SAP1 and SAP2 may be spaced apart from the double-sided adhesive film DAP when viewed in a plane. Accordingly, a space may be provided between the first and second single-sided adhesive films SAP1 and SAP2 and the double-sided adhesive film DAP. The first connection portion CP11 may be disposed in the space and may connect the double-sided adhesive film DAP to the first single-sided adhesive film SAP1, and the second and third connection portions CP21 and CP22 may be disposed in the space and may connect the second single-sided adhesive film SAP2 to the double-sided adhesive film DAP.

FIGS. 12A and 12B show the structure in which the conductive adhesive film CAF6 includes three connection portions CP11, CP21, and CP22, however, the present inventive concept is not limited thereto. In other words, the conductive adhesive film CAF6 may include two or four or more connection portions.

Each of the first, second, and third connection portions CP11, CP21, and CP22 may include the same configuration as that of the connection portion CP shown in FIGS. 7A to 8C. Accordingly, detailed descriptions of the first, second, and third connection portions CP11, CP21, and CP22 may be omitted.

As described above, since the double-sided adhesive film DAP may be electrically connected to the first and second single-sided adhesive films SAP1 and SAP2 through the first, second, and third connection portions CP11, CP21, and CP22, an electrostatic path may be provided between the second support plate SP2 and the ground line GRL via second and third step difference compensation films SCF21 and SCF22, even though at least one of the first and second single-sided adhesive films SAP1 and SAP2 is not in contact with the second support plate SP2, and as a result, the display device DD may have enhanced electrostatic discharge characteristics.

Exemplary embodiments of the present inventive concept provide a display device capable of reducing noise generation caused by pressing. For example, in the above described exemplary embodiments, although the support plate is deformed in the structure in which the conductive adhesive film is disposed between the support plate and the circuit board to prevent the static electricity, the conductive adhesive film may not be repeatedly attached to and detached from the support plate, and as a result, the noise caused by the attachment and detachment actions may be removed. While the inventive concept has been described with reference to exemplary embodiments thereof, it is understood by one of ordinary skill in the art that various changes and modifications can be made thereto without departing from the spirit and scope of the inventive concept as set forth in the attached claims.

What is claimed is:
1. A display device, comprising:
a display module comprising a display panel displaying an image and a circuit board connected to the display panel;
a support plate disposed on a surface of the display module; and
an adhesive film disposed between the circuit board and the support plate, the adhesive film comprising:
a double-sided adhesive film attached to a surface of the support plate and a surface of the circuit board to electrically connect the support plate to the circuit board; and
a single-sided adhesive film attached to one of the surface of the support plate and the surface of the circuit board.
2. The display device of claim 1, wherein the double-sided adhesive film comprises:
a first film including a conductive material;
a first adhesive disposed between the first film and the surface of the support plate; and
a second adhesive disposed between the first film and the surface of the circuit board,
each of the first and second adhesives includes a conductive adhesive material.
3. The display device of claim 2, wherein the single-sided adhesive film comprises:
a second film; and
a third adhesive disposed between the second film and the surface of the circuit board.
4. The display device of claim 3, wherein the second film is thicker than the first film.
5. The display device of claim 4, wherein the second film is spaced apart from the first film.
6. The display device of claim 3, wherein the circuit board comprises:
a ground line;
a cover layer disposed on the ground line and having an opening that exposes a portion of the ground line; and a step difference compensation film disposed adjacent to the opening and being connected to the portion of the ground line.

7. The display device of claim 6, wherein the step difference compensation film comprises:
   a third film including a conductive material; and
   a fourth adhesive disposed between the third film and the portion of the ground line and including a conductive adhesive material,
   wherein the third film is attached to the second adhesive and the third adhesive, and the ground line is electrically connected to the support plate through the step difference compensation film and the double-sided adhesive film.

8. The display device of claim 3, wherein the adhesive film further comprises a connection portion that connects the first film to the second film.

9. The display device of claim 8, wherein the connection portion comprises a fourth film that is integrally formed with the first and second films.

10. The display device of claim 9, wherein the fourth film has a same thickness as one of the first and second films.

11. The display device of claim 1, wherein the display module further comprises:
    a first circuit element disposed on the circuit board and overlapped by the single-sided adhesive film; and
    a second circuit element disposed on the circuit board and overlapped by the double-sided adhesive film, and
    wherein the first circuit element is larger than the second circuit element.

12. The display device of claim 1, wherein the display module comprises a folding area and a plurality of non-folding areas.

13. The display device of claim 12, wherein the adhesive film is disposed in one non-folding area of the non-folding areas.

14. The display device of claim 1, wherein the support plate is a metal plate.

15. The display device of claim 1, further comprising a buffer film disposed between the display panel and the support plate.

16. The display device of claim 1, wherein the display module further comprises a window disposed on the display panel and comprising a flexible material.

17. A display device, comprising:
    a display module comprising a display panel displaying an image and a circuit board electrically connected to the display panel, the display module further comprising a folding area and a plurality of non-folding areas disposed adjacent to opposite ends of the folding area;
    a support plate disposed on a surface of the display module to support the display module; and
    an adhesive film disposed between the circuit board and the support plate in at least one non-folding area of the non-folding areas, the adhesive film comprising:
    a double-sided adhesive film fixed to a surface of the support plate and a surface of the circuit board to form an electrostatic path; and
    a single-sided adhesive film fixed to one of the surface of the support plate and the surface of the circuit board, wherein the display module further comprises a circuit element disposed on the circuit board to overlap the single-sided adhesive film.

18. The display device of claim 17, wherein the double-sided adhesive film comprises:
    a first film including a conductive material;
    a first adhesive disposed between the first film and the surface of the support plate; and
    a second adhesive disposed between the first film and the surface of the circuit board,
    each of the first and second adhesives includes a conductive adhesive material.

19. The display device of claim 18, wherein the single-sided adhesive film comprises:
    a second film; and
    a third adhesive disposed between the second film and the surface of the circuit board.

20. The display device of claim 19, wherein the circuit board comprises:
    a ground line;
    a cover layer disposed on the ground line to cover the ground line, wherein the cover layer includes an opening to expose a portion of the ground line; and
    a step difference compensation film disposed adjacent to the opening and electrically connected to the portion of the ground line.

21. The display device of claim 20, wherein the step difference compensation film comprises:
    a third film including a conductive material; and
    a fourth adhesive disposed between the third film and the portion of the ground line and including a conductive adhesive material,
    wherein the third film is electrically connected to the first film through the second adhesive.

22. The display device of claim 19, wherein the second film is thicker than the first film.

23. The display device of claim 19, wherein the adhesive film further comprises a connection portion that connects the first film to the second film.

24. The display device of claim 23, wherein the connection portion comprises a fourth film that is integrally formed with the first and second films and has a same thickness as one of the first and second films.

* * * * *